United States Patent
Takakuwa et al.

(10) Patent No.: US 7,914,956 B2
(45) Date of Patent: Mar. 29, 2011

(54) DYE-CONTAINING NEGATIVE WORKING CURABLE COMPOSITION, COLOR FILTER AND PRODUCTION METHOD THEREOF

(75) Inventors: Hideki Takakuwa, Shizuoka-ken (JP); Yuki Mizukawa, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 1057 days.

(21) Appl. No.: 11/714,205

(22) Filed: Mar. 6, 2007

(65) Prior Publication Data
US 2007/0212623 A1 Sep. 13, 2007

(30) Foreign Application Priority Data

Mar. 7, 2006 (JP) ................. 2006-061734

(51) Int. Cl.
G02B 5/20 (2006.01)
G03F 7/00 (2006.01)
(52) U.S. Cl. ......................... 430/7; 430/270.1
(58) Field of Classification Search .......... None
See application file for complete search history.

(56) References Cited

U.S. PATENT DOCUMENTS

| | | | |
|---|---|---|---|
| 5,234,791 A | 8/1993 | Dammel et al. | |
| 5,284,943 A | 2/1994 | Tai et al. | |
| 5,478,680 A | 12/1995 | Hishiro et al. | |
| 5,804,102 A | 9/1998 | Oi et al. | |
| 5,830,267 A | 11/1998 | Zambounis et al. | |
| 6,589,672 B1 | 7/2003 | Kobayashi et al. | |
| 2002/0045111 A1 | 4/2002 | Machiguchi et al. | |
| 2004/0185372 A1 | 9/2004 | Takakuwa | |
| 2005/0113478 A1* | 5/2005 | Suzuki | 522/71 |
| 2006/0051685 A1 | 3/2006 | Fujimori et al. | |
| 2006/0246364 A1 | 11/2006 | Fujimori | |
| 2006/0257762 A1 | 11/2006 | Fujimori | |
| 2007/0072096 A1 | 3/2007 | Takakuwa et al. | |
| 2007/0184380 A1* | 8/2007 | Tao et al. | 430/270.1 |
| 2007/0190435 A1 | 8/2007 | Takakuwa et al. | |
| 2009/0047585 A1 | 2/2009 | Seto et al. | |

FOREIGN PATENT DOCUMENTS

| | | |
|---|---|---|
| JP | 1-102469 A | 4/1989 |
| JP | 2-127602 A | 5/1990 |
| JP | 2-199403 A | 8/1990 |
| JP | 2-276866 A | 11/1990 |
| JP | 3-195783 A | 8/1991 |
| JP | 6-75375 A | 3/1994 |
| JP | 7-013014 A | 1/1995 |
| JP | 7-140654 A | 6/1995 |
| JP | 7-111485 B2 | 11/1995 |
| JP | 2002-14222 A | 1/2002 |
| JP | 2002-196481 A | 7/2002 |
| JP | 2002-278056 A | 9/2002 |
| JP | 11-302285 A | 11/2002 |
| JP | 2002-338825 A | 11/2002 |
| JP | 2004-139050 A | 5/2004 |
| JP | 2004-295116 A | 10/2004 |
| JP | 2005-227722 A | 8/2005 |
| JP | 2005-266149 A | 9/2005 |
| WO | WO 2005/083521 A1 | 9/2005 |
| WO | 2006-013697 A1 | 2/2006 |

OTHER PUBLICATIONS

Computer-generated translation of JP 2005-227722 (Aug. 2005).*

* cited by examiner

*Primary Examiner* — John A. McPherson
(74) *Attorney, Agent, or Firm* — Sughrue Mion, PLLC

(57) ABSTRACT

The invention provides a dye-containing negative working curable composition comprising at least a dye, a photopolymerization initiator, a polymerizable monomer, and a colorless compound having a number average molecular weight of 1,000 to 5,000, wherein the ratio of an alkali-soluble resin to the total solid content of the composition is 10% by mass or less.

27 Claims, No Drawings

US 7,914,956 B2

DYE-CONTAINING NEGATIVE WORKING CURABLE COMPOSITION, COLOR FILTER AND PRODUCTION METHOD THEREOF

CROSS-REFERENCE TO RELATED APPLICATION

This application claims priority under 35 USC 119 from Japanese patent Application Nos. 2006-61734, the disclosures of which are incorporated by reference herein.

BACKGROUND OF THE INVENTION

1. Field of the Invention

The present invention relates to a dye-containing negative working curable composition constituting a color filter used for liquid crystal display elements and solid state image pick-up elements and suitable for forming colored images, as well as to a color filter using the dye-containing curable composition and a method of producing the same.

2. Description of the Related Art

As processes for preparing a color filter used for liquid crystal display elements (LCD) and solid state image pick-up elements (CCD, CMOS and the like), a staining process, a printing process, an electrodeposition process and a pigment dispersion process are known.

In the pigment dispersion process, the color filter is prepared by a photolithographic process using a colored radiation-sensitive composition prepared by dispersing a pigment in a photosensitive composition. The color filter prepared by this process is stable with respect to light, heat and the like since pigments are used. A sufficient degree of positional accuracy can be obtained in this process since the colored radiation-sensitive composition is patterned by the photolithographic process, and this process has been widely used as a process suitable for preparing the color filter for a large screen and high accuracy color display.

In preparing a color filter by the pigment dispersion process, the radiation-sensitive composition is first coated on a glass substrate with a spin coater or a roll coater and dried to form a coating film. Then, colored pixels are obtained by patterned-exposure and development of the coating film. The color filter can be prepared by repeating this operation a number of times corresponding to the number of hues.

As the pigment dispersion process, a negative photosensitive composition in which photopolymerizable monomer and photopolymerization initiator are combined with alkali soluble resin is described (see, for example, Japanese Patent Application Laid-Open (JP-A) Nos. 2-199403).

On the other hand, recently, in the color filter for solid state image pick-up elements, even higher resolution is desired, but the conventional pigment dispersions have difficulties in further improving the resolution. Because of the problem such as generation of color irregularities due to coarse particles of the pigment, it is not suitable for the use which requires fine patterns such as solid state image pick-up elements.

In view of the problem, technologies in which dyes are used instead of pigments have been proposed. However, photosensitive compositions containing dyes are generally lower in sensitivity as compared with pigment containing systems. In response to this problem, methods in which no alkali-soluble resins are added are known (see, for example, WO 2005-083521).

Further, methods of adding compounds having a hydroxyl group within a molecule to negative working curing systems using organic solvent-soluble dyes, to thereby reduce contamination generation over time are known (see, for example, JP-A-2005-227722).

SUMMARY OF THE INVENTION

However, the systems with a small amount of alkali-soluble resins are disadvantageous in that the contamination generation is often increased over time. Further, the systems are poor in adhesion to objects to be coated, supports and the like when coating is carried out.

On the other hand, although the systems with a larger amount of alkali-soluble resins are effective for improvement of contamination generation and adhesion, it has been difficult to achieve improvement in sensitivity in conjunction therewith.

In view of these circumstances, the invention provides a dye-containing negative working curable composition which has stability over time with reduced contamination generation and has adhesion to objects to be coated or supports, and which further exhibits high sensitivity and excellent pattern forming properties without development residue.

Further, the invention provides a color filter, which uses the dye-containing negative working curable composition, and is excellent in adhesion to a support, and a production method thereof.

A first aspect of the invention provides, a dye-containing negative working curable composition comprising at least a dye, a photopolymerization initiator, a polymerizable monomer, and a colorless compound having a number average molecular weight of 1,000 to 5,000, wherein the ratio of an alkali-soluble resin to the total solid content of the composition is 10% by mass or less.

A second aspect of the invention provides, a method of producing a color filter comprising: coating the dye-containing negative working curable composition according to the first aspect onto a support to form a coated film; exposing the coated film through a mask; and developing the coated film to form a pattern.

A third aspect of the invention provides, a color filter formed by the production method for a color filter according to the second aspect.

DETAILED DESCRIPTION OF THE INVENTION

The dye-containing negative working curable composition of the present invention, the color filter using the composition, and the method for producing the same will be described in detail below.

<<Dye-containing Negative Working Curable Composition>>

The dye-containing negative working curable composition of the invention (which may be hereinafter referred to as "the composition of the invention") contains at least a dye, a photopolymerization initiator, a polymerizable monomer, and a colorless compound having a molecular weight of 1,000 to 5,000. The dye-containing negative working curable composition may contain an alkali-soluble resin, the ratio of which to the total solid content of the composition is 10% by mass or less. Further, generally the composition of the invention may contain an organic solvent, and additionally may contain another component such as a crosslinking agent.

~Dye~

The dye-containing curable composition of the invention contains at least one kind selected from dyes.

The dye may be appropriately selected from known dyes depending on the intended use, etc. The composition may contain two or more dyes in combination.

Particularly, the dye is preferably a dye soluble in an organic solvent (hereinafter referred to as "an organic solvent-soluble dye"). The organic solvent-1 soluble dye is not particularly limited, and may be selected from a known dye for color filters.

The property of "soluble in an organic solvent" means that the dye is completely dissolved in an organic solvent at 25° C. to provide a 20% solution.

The organic solvent-soluble dye include dyes described in JP-A Nos. 64-90403, 64-91102, 1-94301, 6-11614, 6-35183; Japanese Patent No. 2592207; and U.S. Pat. Nos. 4,808,501, 5,667,920 and 5,059,500.

As the chemical structure, dyes based on azos such as pyrazole azo, anilinoazo, pyrazolotriazole azo and pyridone azo, triphenylmethane, anthraquinone, benzylidene, oxonol, cyanine, phenothiazine, pyrrolopyrazole azomethine, xanthene, phthalocyanine, benzopyran, indigo, anthrapyridone, and the like can be used. Dyes based on azos such as pyrazole azo, anilinoazo, pyrazolotriazole azo and pyridone azo, and anthrapyridone are particularly preferred.

Otherwise, the dye(s) selected from direct dyes, basic dyes, mordant dyes, acid mordant dyes, azoic dyes, disperse dyes, oil soluble dyes and food dyes, and/or derivatives thereof are preferable.

The acid dye and derivatives thereof will be described below. The acid dye is not particularly restricted, so long as it is a dye having acidic groups such as sulfonic acid, carboxylic acid and phenolic hydroxyl groups. However, the acid dye should be soluble in the organic solvent and developer used for preparation and development of the composition, be able to form salts with basic compounds, interact with other component in the curable composition, and have enough light absorbance, light fastness and heat resistance. Therefore, the acid dye is selected by taking all these characteristics into consideration.

While specific examples of the acid dye are described below, the invention is not restricted to these examples. They are the following dyes, and derivatives of these dyes:

acid alizarin violet N;
acid black 1, 2, 24, 48;
acid blue 1, 7, 9, 15, 18, 23, 25, 27, 29, 40, 42, 45, 51, 62, 70, 74, 80, 83, 86, 87, 90, 92, 96, 103, 112, 113, 120, 129, 138, 147, 150, 158, 171, 182, 192, 210, 242, 243, 256, 259, 267, 278, 280, 285, 290, 296, 315, 324:1, 335, 340;
acid chrome violet K;
acid Fuchsin;
acid green 1, 3, 5, 9, 16, 25, 27, 50, 58, 63, 65, 80, 104, 105, 106, 109;
acid orange 6, 7, 8, 10, 12, 26, 50, 51, 52, 56, 62, 63, 64, 74, 75, 94, 95, 107, 108, 169, 173;
acid red 1, 4, 8, 14, 17, 18, 26, 27, 29, 31, 34, 35, 37, 42, 44, 50, 51, 52, 57, 66, 73, 80, 87, 88, 91, 92, 94, 97, 103, 111, 114, 129, 133, 134, 138, 143, 145, 150, 151, 158, 176, 182, 183, 198, 206, 211, 215, 216, 217, 227, 228, 249, 252, 257, 258, 260, 261, 266, 268, 270, 274, 277, 280, 281, 195, 308, 312, 315, 316, 339, 341, 345, 346, 349, 382, 383, 394, 401, 412, 417, 418, 422, 426;
acid violet 6B, 7, 9, 17, 19;
acid yellow 1, 3, 7, 9, 11, 17, 23, 25, 29, 34, 36, 38, 40, 42, 54, 65, 72, 73, 76, 79, 98, 99, 111, 112, 113, 114, 116, 119, 123, 128, 134, 135, 138, 139, 140, 144, 150, 155, 157, 160, 161, 163, 168, 169, 172, 177, 178, 179, 184, 190, 193, 196, 197, 199, 202, 203, 204, 205, 207, 212, 214, 220, 221, 228, 230, 232, 235, 238, 240, 242, 243, 251;
Direct Yellow 2, 33, 34, 35, 38, 39, 43, 47, 50, 54, 58, 68, 69, 70, 71, 86, 93, 94, 95, 98, 102, 108, 109, 129, 136, 138, 141;
Direct Orange 34, 39, 41, 46, 50, 52, 56, 57, 61, 64, 65, 68, 70, 96, 97, 106, 107;
Direct Red 79, 82, 83, 84, 91, 92, 96, 97, 98, 99, 105, 106, 107, 172, 173, 176, 177, 179, 181, 182, 184, 204, 207, 211, 213, 218, 220, 221, 222, 232, 233, 234, 241, 243, 246, 250;
Direct Violet 47, 52, 54, 59, 60, 65, 66, 79, 80, 81, 82, 84, 89, 90, 93, 95, 96, 103, 104;
Direct Blue 57, 77, 80, 81, 84, 85, 86, 90, 93, 94, 95, 97, 98, 99, 100, 101, 106, 107, 108, 109, 113, 114, 115, 117, 119, 137, 149, 150, 153, 155, 156, 158, 159, 160, 161, 162, 163, 164, 166, 167, 170, 171, 172, 173, 188, 189, 190, 192, 193, 194, 196, 198, 199, 200, 207, 209, 210, 212, 213, 214, 222, 228, 229, 237, 238, 242, 243, 244, 245, 247, 248, 250, 251, 252, 256, 257, 259, 260, 268, 274, 275, 293;
Direct Green 25, 27, 31, 32, 34, 37, 63, 65, 66, 67, 68, 69, 72, 77, 79, 82;
Mordant Yellow 5, 8, 10, 16, 20, 26, 30, 31, 33, 42, 43, 45, 56, 50, 61, 62, 65;
Mordant Orange 3, 4, 5, 8, 12, 13, 14, 20, 21, 23, 24, 28, 29, 32, 34, 35, 36, 37, 42, 43, 47, 48;
Mordant Red 1, 2, 3, 4, 9, 11, 12, 14, 17, 18, 19, 22, 23, 24, 25, 26, 30, 32, 33, 36, 37, 38, 39, 41, 43, 45, 46, 48, 53, 56, 63, 71, 74, 85, 86, 88, 90, 94, 95;
Mordant Violet 2, 4, 5, 7, 14, 22, 24, 30, 31, 32, 37, 40, 41, 44, 45, 47, 48, 53, 58;
Mordant Blue 2, 3, 7, 8, 9, 12, 13, 15, 16, 19, 20, 21, 22, 23, 24, 26, 30, 31, 32, 39, 40, 41, 43, 44, 48, 49, 53, 61, 74, 77, 83, 84;
Mordant Green 1, 3, 4, 5, 10, 15, 19, 26, 29, 33, 34, 35, 41, 43, 53;
Food Yellow 3, and derivatives thereof are preferred.
Among these acid days, acid black 24;
acid blue 23, 25, 29, 62, 80, 86, 87, 92, 138, 158, 182, 243, 324:1;
acid orange 8, 51, 56, 74, 63;
acid red 1, 4, 8, 34, 37, 42, 52, 57, 80, 97, 114, 143, 145, 151, 183, 217, 249;
acid violet 7;
acid yellow 17, 25, 29, 34, 42, 72, 76, 99, 111, 112, 114, 116, 134, 155, 169, 172, 184, 220, 228, 230, 232, 243;
Acid Green 25, and derivatives thereof are preferred.

The derivatives of the acid available dye include inorganic salts of the acid dye having a sulfonic acid group and a carboxylic acid group, and salts of the acid dye with nitrogen containing compounds. The derivative is not particularly restricted so long as it is soluble in a solution of the curable composition prepared. However, the derivatives of the acid dye should be selected considering all the characteristics such as solubility in the organic solvent and developer used for preparation and development of the composition, interaction with other component in the curable composition, a light absorbance, a light-fastness and a heat resistance into consideration.

Forming a salt between the acid dye and nitrogen-containing compound may be effective for improving solubility (solubility in organic solvents) of the acid dye, heat resistance and light-fastness.

The nitrogen containing compound that forms a salt with the acid dye, and the nitrogen containing compound that forms an amide bond with the acid dye are selected considering all the characteristics such as solubility of the salt or amide compound in the organic solvent or the developer used for preparation and development, a salt forming ability, a light absorbance and a color value of the dye, interaction between the nitrogen containing compound and other components in the curable composition, and a heat resistance and a light-fastness as a coloring agent. The molecular weight of the nitrogen-containing compound is preferably as small as possible when the compound is selected considering only the light absorbance and color value. The molecular weight is preferably 300 or less, more preferably 280 or less, and particularly preferably 250 or less.

The molar ratio (n) of the nitrogen-containing compound to the acid dye in the salt between the acid dye and nitrogen containing compound denotes the ratio of the acid dye molecule to an amine compound as a counter ion. The molar ratio n may be freely selected depending on the salt forming condition between the acid dye and amine compound. For example, n is a value satisfying the relation of $0<n\leq 5$ of the number of the functional groups in the acid of the acid dye in most practical cases, and may be selected considering all the required characteristics such as solubility in the organic solvent used and developer, salt forming ability, light absorbance, interaction with other components in the dye-containing curable composition, light-fastness, and heat resistance. When n is selected considering only the light absorbance, it satisfies the relation of preferably $0<n\leq 4.5$, more preferably $0<n\leq 4$, and particularly $0<n\leq 3.5$.

Then the dye, particularly an organic solvent-soluble phthalocyanine compound, which is preferably used as the organic solvent-soluble dye, will be described in detail.

<Organic Solvent-soluble Phthalocyanine>

It is preferred that the dye-containing negative working curable composition of the invention contains at least one kind of organic solvent-soluble phthalocyanine dyes as a coloring agent. Any phthalocyanine dye can be used in the invention as long as it is soluble in an organic solvent.

Examples of the organic solvent-soluble phthalocyanine dye include dyes described in JP-A Nos. 5-333207, 6-51115 and 6-194828.

Among these, particularly preferable examples of the phthalocyanine dye include a dye compound represented by the following formula (I) or a dye compound represented by the following formula (II).

[Dye Compound Represented by Formula (I)]

The dye compound represented by formula (I) will be described.

The dye compound represented by the following formula (I) is an organic solvent-soluble phthalocyanine dye having good molar absorption coefficient and color value. Such a dye is a compound which provides a high light-fastness and high heat resistance at the same time.

formula (I)

In the formula (I), ring $A^1$, ring $A^2$, ring $A^3$ and ring $A^4$ each independently represent one of the following aromatic rings. The aromatic ring has many isomers depending on the condensed ring direction of the aromatic ring and the substitution position of a substituent bound thereto.

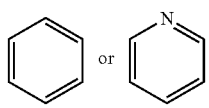

Further, at least one of ring $A^1$, ring $A^2$, ring $A^3$ and ring $A^4$ represents the following aromatic ring.

Specific examples of the base skeleton of the formula (I) include five kinds of structures in the following formulas (1) to (5). Depending on the difference in the condensation direction of a pyridine ring, there are isomers with the N position in different positions. Further, there are also respective isomers in which the substitution position of a substituent such as bromine is different.

(1)

(2)

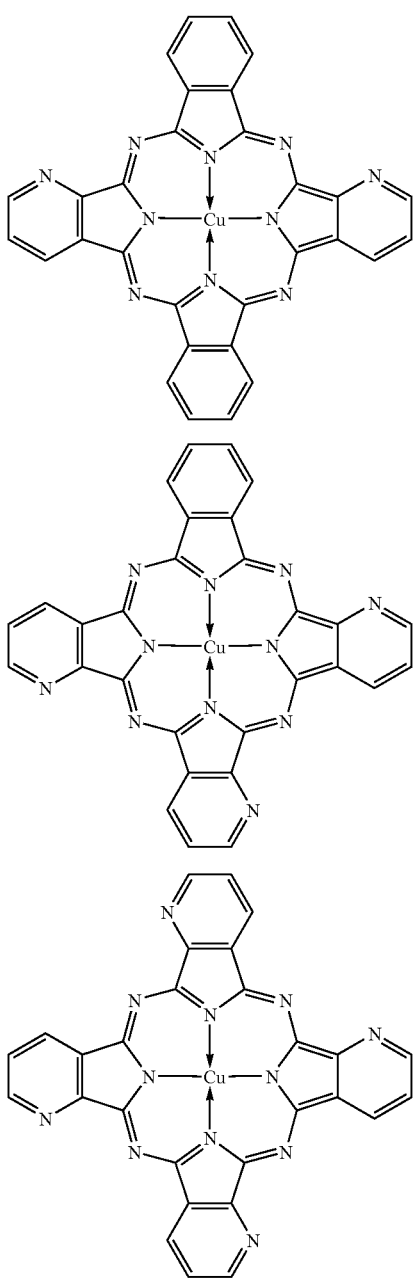

In the formula (I), $R^1$ and $R^2$ each independently represent hydrogen atom or a substituted or unsubstituted alkyl group; while $R^1$ and $R^2$ are not a hydrogen atom at the same time. Further, m is an integer from 1 to 8 and n is an integer from 1 to 4.

As the unsubstituted alkyl group represented by $R^1$ or $R^2$, an alkyl group having 1 to 12 carbon atoms is preferred. Examples thereof include straight chained or branched alkyl groups such as methyl group, ethyl group, n-propyl group, isopropyl group, n-butyl group, isobutyl group, n-hexyl group, 2-ethylhexyl group, n-octyl group and n-dodecyl group, and among these straight-chained or branched alkyl group having 4 to 12 carbon atoms is preferred.

As the substituted alkyl group represented by $R^1$ or $R^2$, "a substituted alkyl group containing an oxygen atom in at least one form of an ether bond, a carbonyl bond and an ester bond" is preferred, and a straight-chained, branched or cyclic substituted alkyl group having 2 to 12 carbon atoms containing 1 to 4 oxygen atoms in at least one form of the above is particularly preferred. Examples of the substituted alkyl group include methoxymethyl group, ethoxymethyl group, butoxymethyl group, methoxyethyl group, ethoxyethyl group, 3-methoxypropyl group, 3-ethoxypropyl group, 3-butoxypropyl group, methoxyethoxyethyl group, ethoxyethoxyethyl group, butoxyethoxyethyl group, methoxyethoxyethoxyethyl group, ethoxyethoxyethoxyethyl group, butoxyethoxyethoxyethyl group, acetylmethyl group, acetylethyl group, propionylmethyl group, propionylethyl group, tetrahydrofurfuryloxymethyl group, 2,2-dimethyl-1,3-dioxolane-4-methoxymethyl group, 2-(1,3-dioxolane)ethoxymethyl group, 2-(1,3-dioxane)ethoxymethyl group, methoxycarbonylmethyl group, ethoxycarbonylethyl group, propoxycarbonylethyl group, butoxycarbonylethyl group, pentoxycarbonylbutyl group, 1-(butoxymethyl)ethyl group, 1-(methoxymethyl)propyl group, 1-(ethoxymethyl)propyl group, 1-(butoxymethyl)propyl group, 1-(2-methoxy-ethoxy-methyl)propyl group, 1-(2-ethoxy-ethoxy-methyl)propyl group, 1-(2-methoxy-2-ethoxy-2-ethoxymethyl)ethyl group, 1-(2-ethoxy-2-ethoxy-2-ethoxymethyl)ethyl group, 1-(2-butoxy-2-ethoxy-2-ethoxymethyl)ethyl group, 1-(2-methoxy-2-ethoxy-2-ethoxymethyl)propyl group, 1-(2-ethoxy-2-ethoxy-2-ethoxymethyl)propyl group, 1-(2-propoxy-2-ethoxy-2-ethoxymethyl)propyl group, 1-(2-butoxy-2-ethoxy-2-ethoxymethyl)propyl group, 1-(2-methoxy-2-ethoxy-2-ethoxymethyl)butyl group, 1-(2-ethoxy-2-ethoxy-2-ethoxymethyl)butyl group, 1-(2-propoxy-2-ethoxy-2-ethoxymethyl)butyl group,
1-(2-methoxy-2-ethoxy-2-ethoxymethyl)pentyl group, 1-(2-ethoxy-2-ethoxy-2-ethoxymethyl)pentyl group, 1-(2-methoxy-2-ethoxy-2-ethoxy-2-ethoxymethyl)ethyl group, 1-(2-ethoxy-2-ethoxy-2-ethoxy-2-ethoxymethyl)ethyl group, 1-(2-methoxy-2-ethoxy-2-ethoxy-2-ethoxymethyl)propyl group, 1-(2-ethoxy-2-ethoxy-2-ethoxy-2-ethoxymethyl)propyl group, 1-(2-methoxy-2-ethoxy-2-ethoxy-2-ethoxymethyl)butyl group, 1-(2-methoxy-2-ethoxy-2-ethoxy-2-ethoxyethyl)ethyl group, 1-(2-ethoxy-2-ethoxy-2-ethoxy-2-ethoxyethyl)ethyl group, 1-(2-methoxy-2-ethoxy-2-ethoxy-2-ethoxyethyl)propyl group, 1,1-di(methoxymethyl)methyl group, 1,1-di(ethoxymethyl)methyl group, 1,1-di(propoxymethyl)methyl group, 1,1-di(butoxymethyl)methyl group, 1,1-di(2-methoxy-ethoxymethyl)methyl group, 1,1-di(2-ethoxy-ethoxymethyl)methyl group, 1,1-di(2-propoxy-ethoxymethyl)methyl group and 1,1-di(2-butoxy-ethoxymethyl)methyl group.

The above-described $R^1$ and $R^2$ in the form of each independently a hydrogen atom ($R^1$ and $R^2$ are not a hydrogen atom at the same time), an unsubstituted alkyl group or "a substituted alkyl group containing oxygen atom in at least one form of ether bond, carbonyl bond and an ester bond" is preferred.

Among the above, $R^1$ and $R^2$ in the form of each independently a hydrogen atom ($R^1$ and $R^2$ are not a hydrogen atom at the same time), an unsubstituted alkyl group having 1 to 12 carbon atoms or "a substituted alkyl group having 2 to 12 carbon atoms containing 1 to 4 oxygen atoms in at least one form of an ether bond, a carbonyl bond and an ester bond" is particularly preferred, and among these, at least one of $R^1$ and $R^2$ in a form of "a substituted alkyl group having 2 to 12 carbon atoms containing 1 to 4 oxygen atoms in at least one form of an ether bond, a carbonyl bond and an ester bond" is preferred in the point of having strong solubility to a polar organic solvent.

At least one of $R^1$ and $R^2$ being a substituted alkyl group represented by the following formula (I-a) such as tetraazaporphyrin compounds is particularly preferred.

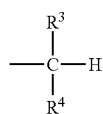
(I-a)

In the formula (I-a), $R^3$ and $R^4$ are each independently a hydrogen atom, an unsubstituted alkyl group, "a substituted alkyl group containing an oxygen atom in at least one form of an ether bond, a carbonyl bond and an ester bond", an alkylcarbonyl group or an alkoxycarbonyl group, while at least one of $R^3$ and $R^4$ is "a substituted alkyl group containing an oxygen atom in at least one form of an ether bond, a carbonyl bond and an ester bond," an alkylcarbonyl group or an alkoxycarbonyl group.

As the unsubstituted alkyl group represented by $R^3$ or $R^4$, an alkyl group having 1 to 8 carbon atoms is preferred. Examples thereof include methyl group, ethyl group, propyl group, isopropyl group, butyl group, isobutyl group, pentyl group, hexyl group and octyl group.

As "the substituted alkyl group containing an oxygen atom in at least one form of an ether bond, a carbonyl bond and an ester bond" represented by $R^3$ or $R^4$, a substituted alkyl group having 2 to 10 carbon atoms containing 1 to 4 oxygen atoms is preferred. Examples thereof include methoxymethyl group, ethoxymethyl group, propoxymethyl group, butoxymethyl group, methoxyethoxymethyl group, ethoxyethoxymethyl group, propoxyethoxymethyl group, butoxyethoxymethyl group, methoxyethoxyethoxymethyl group, ethoxyethoxyethoxymethyl group, propoxyethoxyethoxymethyl group, butoxyethoxyethoxymethyl group, methoxyethoxyethoxymethyl group, ethoxyethoxyethoxymethyl group, propoxyethoxyethoxymethyl group, butoxyethoxyethoxymethyl group, acetylmethyl group, propionylmethyl group, tetrahydrofurfuryloxymethyl group, 2,2-dimethyl-1,3-dioxolane-4-methoxymethyl group, 2-(1,3-dioxolane)ethoxymethyl group, 2-(1,3-dioxane)ethoxymethyl group, methoxycarbonylmethyl group, ethoxycarbonylmethyl group, propoxycarbonylmethyl group, butoxycarbonylmethyl group and pentoxycarbonylmethyl group.

As the alkylcarbonyl group and the alkoxycarbonyl group represented by $R^3$ or $R^4$, an alkyl carbonyl group having 2 to 10 carbon atoms and an alkoxycarbonyl group having 2 to 10 carbon atoms are preferred. Examples thereof include acetyl group, propionyl group, propylcarbonyl group, methoxycarbonyl group, ethoxycarbonyl group, propoxycarbonyl group, butoxycarbonyl group and pentoxycarbonyl group.

In the formula (I), m is an integer of 1 to 8. Among these an integer of 1 to 6 is preferred, and an integer of 1 to 4 is particularly preferred in the point of having high absorbance. In addition, n is an integer of 1 to 4. Among these, 2 or 3 is preferred, and 2 is particularly preferred.

A tetraazaporphyrin compound represented by the formula (I) is a compound containing a portion or a whole of these many isomers.

Exemplified compounds (specific examples 1 to 157) of the tetraazaporphyrin compound represented by the formula (I) are presented below. The invention is not limited to these specific examples.

| | Number of benzene | Number of N | m | n | $R^1$ | $R^2$ |
|---|---|---|---|---|---|---|
| 1 | 3 | 1 | 1 | 1 | H | $-C_2H_4OC_2H_5$ |
| 2 | 3 | 1 | 1 | 2 | H | $-C_2H_4OC_2H_5$ |
| 3 | 3 | 1 | 1 | 3 | H | $-C_2H_4OC_2H_5$ |
| 4 | 3 | 1 | 1 | 4 | H | $-C_2H_4OC_2H_5$ |
| 5 | 3 | 1 | 1 | 1 | $-C_2H_4OC_2H_5$ | $-C_2H_4OC_2H_5$ |
| 6 | 3 | 1 | 1 | 1 | H | $-C_3H_6OC_4H_9$ |
| 7 | 3 | 1 | 1 | 2 | H | $-C_3H_6OC_4H_9$ |
| 8 | 3 | 1 | 1 | 3 | H | $-C_3H_6OC_4H_9$ |
| 9 | 3 | 1 | 1 | 4 | H | $-C_3H_6OC_4H_9$ |
| 10 | 3 | 1 | 1 | 1 | $-C_2H_4OCH_3$ | $-C_2H_4OCH_3$ |
| 11 | 3 | 1 | 1 | 2 | $-C_2H_4OCH_3$ | $-C_2H_4OCH_3$ |
| 12 | 3 | 1 | 1 | 3 | $-C_2H_4OCH_3$ | $-C_2H_4OCH_3$ |
| 13 | 3 | 1 | 1 | 4 | $-C_2H_4OCH_3$ | $-C_2H_4OCH_3$ |
| 14 | 3 | 1 | 1 | 2 | $-C_4H_9$ | $-C_4H_9$ |
| 15 | 3 | 1 | 1 | 1 | H | $-CH_2-CH(C_2H_5)-C_4H_9$ |
| 16 | 3 | 1 | 1 | 2 | H | $-CH_2-CH(C_2H_5)-C_4H_9$ |
| 17 | 3 | 1 | 1 | 3 | H | $-CH_2-CH(C_2H_5)-C_4H_9$ |

-continued

| | Number of ⬡ | Number of (pyridine) | m | n | R¹ | R² |
|---|---|---|---|---|---|---|
| 18 | 3 | 1 | 1 | 4 | H | —CH$_2$—CH(C$_2$H$_5$)—C$_4$H$_9$ |
| 19 | 3 | 1 | 1 | 1 | H | —C$_3$H$_6$—OCH$_2$—CH(C$_2$H$_5$)—C$_4$H$_9$ |
| 20 | 3 | 1 | 1 | 2 | H | —C$_3$H$_6$—OCH$_2$—CH(C$_2$H$_5$)—C$_4$H$_9$ |
| 21 | 3 | 1 | 1 | 3 | H | —C$_3$H$_6$—OCH$_2$—CH(C$_2$H$_5$)—C$_4$H$_9$ |
| 22 | 3 | 1 | 4 | 2 | H | —C$_3$H$_6$—OCH$_2$—CH(C$_2$H$_5$)—C$_4$H$_9$ |
| 23 | 3 | 1 | 5 | 2 | H | —C$_2$H$_4$OC$_2$H$_4$OC$_2$H$_5$ |
| 24 | 3 | 1 | 6 | 1 | —C$_2$H$_5$ | —C$_2$H$_4$OC$_2$H$_5$ |
| 25 | 3 | 1 | 8 | 1 | —i-C$_3$H$_7$ | —CH$_2$O—C$_2$H$_4$—(1,3-dioxane) |
| 26 | 3 | 1 | 3 | 2 | H | —CH(C$_2$H$_5$)—CH$_2$OCH$_3$ |
| 27 | 3 | 1 | 1 | 1 | H | —CH(C$_2$H$_5$)—CH$_2$OC$_2$H$_4$OC$_2$H$_5$ |
| 28 | 3 | 1 | 1 | 2 | H | —CH(C$_2$H$_5$)—CH$_2$OC$_2$H$_4$OC$_2$H$_5$ |
| 29 | 3 | 1 | 2 | 2 | H | —CH(C$_2$H$_5$)—CH$_2$OC$_2$H$_4$OC$_2$H$_5$ |
| 30 | 3 | 1 | 3 | 2 | H | —CH(C$_2$H$_5$)—CH$_2$OC$_2$H$_4$OC$_2$H$_5$ |
| 31 | 3 | 1 | 1 | 1 | H | —CH(i-C$_3$H$_7$)—COOCH$_3$ |
| 32 | 3 | 1 | 1 | 2 | H | —CH(i-C$_3$H$_7$)—COOCH$_3$ |
| 33 | 3 | 1 | 1 | 2 | H | —CH(i-C$_3$H$_7$)—COOCH$_3$ |
| 34 | 3 | 1 | 1 | 1 | H | —CH(i-C$_3$H$_7$)—COOCH$_3$ |
| 35 | 3 | 1 | 3 | 2 | —n-C$_8$H$_{17}$ | —CH(C$_2$H$_5$)—CH$_2$OC$_2$H$_4$OC$_2$H$_5$ |

-continued

| | Number of ⌬ | Number of N⌬ | m | n | R$^1$ | R$^2$ |
|---|---|---|---|---|---|---|
| 36 | 3 | 1 | 4 | 2 | H | —CH(COOC$_2$H$_4$OC$_2$H$_5$)COOC$_2$H$_4$OC$_2$H$_5$ |
| 37 | 3 | 1 | 1 | 1 | —C$_2$H$_4$OC$_2$H$_4$OC$_2$H$_5$ | —C$_2$H$_4$OC$_2$H$_4$OC$_2$H$_5$ |
| 38 | 2 | 2 | 1 | 1 | H | —C$_2$H$_4$OC$_2$H$_5$ |
| 39 | 2 | 2 | 1 | 2 | H | —C$_2$H$_4$OC$_2$H$_5$ |
| 40 | 2 | 2 | 1 | 3 | H | —C$_2$H$_4$OC$_2$H$_5$ |
| 41 | 2 | 2 | 1 | 4 | H | —C$_2$H$_4$OC$_2$H$_5$ |
| 42 | 2 | 2 | 1 | 2 | —C$_2$H$_4$OC$_2$H$_5$ | —C$_2$H$_4$OC$_2$H$_5$ |
| 43 | 2 | 2 | 1 | 1 | H | —C$_3$H$_6$OC$_4$H$_9$ |
| 44 | 2 | 2 | 1 | 2 | H | —C$_3$H$_6$OC$_4$H$_9$ |
| 45 | 2 | 2 | 1 | 3 | H | —C$_3$H$_6$OC$_4$H$_9$ |
| 46 | 2 | 2 | 1 | 4 | H | —C$_3$H$_6$OC$_4$H$_9$ |
| 47 | 2 | 2 | 1 | 1 | —C$_2$H$_4$OCH$_3$ | —C$_2$H$_4$OCH$_3$ |
| 48 | 2 | 2 | 1 | 2 | —C$_2$H$_4$OCH$_3$ | —C$_2$H$_4$OCH$_3$ |
| 49 | 2 | 2 | 1 | 3 | —C$_2$H$_4$OCH$_3$ | —C$_2$H$_4$OCH$_3$ |
| 50 | 2 | 2 | 1 | 4 | —C$_2$H$_4$OCH$_3$ | —C$_2$H$_4$OCH$_3$ |
| 51 | 2 | 2 | 1 | 3 | —C$_4$H$_9$ | —C$_4$H$_9$ |
| 52 | 2 | 2 | 1 | 1 | H | —CH$_2$—CH(C$_2$H$_5$)—C$_4$H$_9$ |
| 53 | 2 | 2 | 1 | 2 | H | —CH$_2$—CH(C$_2$H$_5$)—C$_4$H$_9$ |
| 54 | 2 | 2 | 1 | 3 | H | —CH$_2$—CH(C$_2$H$_5$)—C$_4$H$_9$ |
| 55 | 2 | 2 | 1 | 4 | H | —CH$_2$—CH(C$_2$H$_5$)—C$_4$H$_9$ |
| 56 | 2 | 2 | 1 | 1 | H | —C$_3$H$_6$—OCH$_2$—CH(C$_2$H$_5$)—C$_4$H$_9$ |
| 57 | 2 | 2 | 1 | 2 | H | —C$_3$H$_6$—OCH$_2$—CH(C$_2$H$_5$)—C$_4$H$_9$ |
| 58 | 2 | 2 | 1 | 3 | H | —C$_3$H$_6$—OCH$_2$—CH(C$_2$H$_5$)—C$_4$H$_9$ |
| 59 | 2 | 2 | 1 | 4 | H | —C$_3$H$_6$—OCH$_2$—CH(C$_2$H$_5$)—C$_4$H$_9$ |
| 60 | 2 | 2 | 1 | 4 | H | —C$_2$H$_4$OC$_2$H$_4$OC$_2$H$_5$ |
| 61 | 2 | 2 | 1 | 1 | —C$_2$H$_5$ | —C$_2$H$_4$OC$_2$H$_5$ |
| 62 | 2 | 2 | 2 | 2 | —i-C$_3$H$_7$ | —CH$_2$O—C$_2$H$_4$—(1,3-dioxane) |
| 63 | 2 | 2 | 3 | 3 | H | —CH(C$_2$H$_5$)—CH$_2$OCH$_3$ |
| 64 | 2 | 2 | 1 | 1 | H | —CH(C$_2$H$_5$)—CH$_2$OC$_2$H$_4$OC$_2$H$_5$ |

-continued

| Number of benzene | Number of N | m | n | R¹ | R² |
|---|---|---|---|---|---|
| 65 | 2 | 2 | 1 | 2 | H | —CH(C$_2$H$_5$)—CH$_2$OC$_2$H$_4$OC$_2$H$_5$ |
| 66 | 2 | 2 | 3 | 3 | H | —CH(C$_2$H$_5$)—CH$_2$OC$_2$H$_4$OC$_2$H$_5$ |
| 67 | 2 | 2 | 1 | 4 | H | —CH(C$_2$H$_5$)—CH$_2$OC$_2$H$_4$OC$_2$H$_5$ |
| 68 | 2 | 2 | 1 | 1 | H | —CH(i-C$_3$H$_7$)—COOCH$_3$ |
| 69 | 2 | 2 | 2 | 2 | H | —CH(i-C$_3$H$_7$)—COOCH$_3$ |
| 70 | 2 | 2 | 3 | 3 | H | —CH(i-C$_3$H$_7$)—COOCH$_3$ |
| 71 | 2 | 2 | 1 | 4 | H | —CH(i-C$_3$H$_7$)—COOCH$_3$ |
| 72 | 2 | 2 | 1 | 4 | —n-C$_8$H$_{17}$ | —CH(C$_2$H$_5$)—CH$_2$OC$_2$H$_4$OC$_2$H$_5$ |
| 73 | 2 | 2 | 1 | 1 | H | —CH(COOC$_2$H$_4$OC$_2$H$_5$)—COOC$_2$H$_4$OC$_2$H$_5$ |
| 74 | 2 | 2 | 2 | 2 | —C$_2$H$_4$OC$_2$H$_4$OC$_2$H$_5$ | —C$_2$H$_4$OC$_2$H$_4$OC$_2$H$_5$ |
| 75 | 1 | 3 | 1 | 1 | H | —C$_2$H$_4$OC$_2$H$_5$ |
| 76 | 1 | 3 | 2 | 2 | H | —C$_2$H$_4$OC$_2$H$_5$ |
| 77 | 1 | 3 | 1 | 3 | H | —C$_2$H$_4$OC$_2$H$_5$ |
| 78 | 1 | 3 | 1 | 4 | H | —C$_2$H$_4$OC$_2$H$_5$ |
| 79 | 1 | 3 | 1 | 3 | —C$_2$H$_4$OC$_2$H$_5$ | —C$_2$H$_4$OC$_2$H$_5$ |
| 80 | 1 | 3 | 1 | 1 | H | —C$_3$H$_6$OC$_4$H$_9$ |
| 81 | 1 | 3 | 1 | 2 | H | —C$_3$H$_6$OC$_4$H$_9$ |
| 82 | 1 | 3 | 1 | 3 | H | —C$_3$H$_6$OC$_4$H$_9$ |
| 83 | 1 | 3 | 1 | 4 | H | —C$_3$H$_6$OC$_4$H$_9$ |
| 84 | 1 | 3 | 1 | 1 | —C$_2$H$_4$OCH$_3$ | —C$_2$H$_4$OCH$_3$ |
| 85 | 1 | 3 | 1 | 2 | —C$_2$H$_4$OCH$_3$ | —C$_2$H$_4$OCH$_3$ |
| 86 | 1 | 3 | 1 | 3 | —C$_2$H$_4$OCH$_3$ | —C$_2$H$_4$OCH$_3$ |
| 87 | 1 | 3 | 1 | 4 | —C$_2$H$_4$OCH$_3$ | —C$_2$H$_4$OCH$_3$ |
| 88 | 1 | 3 | 1 | 4 | —C$_4$H$_9$ | —C$_4$H$_9$ |
| 89 | 1 | 3 | 1 | 1 | H | —CH$_2$—CH(C$_2$H$_5$)—C$_4$H$_9$ |
| 90 | 1 | 3 | 1 | 2 | H | —CH$_2$—CH(C$_2$H$_5$)—C$_4$H$_9$ |
| 91 | 1 | 3 | 1 | 3 | H | —CH$_2$—CH(C$_2$H$_5$)—C$_4$H$_9$ |
| 92 | 1 | 3 | 1 | 4 | H | —CH$_2$—CH(C$_2$H$_5$)—C$_4$H$_9$ |

-continued

| | Number of 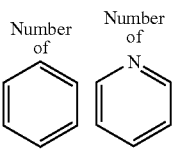 | Number of N-ring | m | n | R¹ | R² |
|---|---|---|---|---|---|---|
| 93 | 1 | 3 | 1 | 1 | H | —$C_3H_6$—$OCH_2$—CH(—$C_2H_5$)—$C_4H_9$ |
| 94 | 1 | 3 | 1 | 2 | H | —$C_3H_6$—$OCH_2$—CH(—$C_2H_5$)—$C_4H_9$ |
| 95 | 1 | 3 | 1 | 3 | H | —$C_3H_6$—$OCH_2$—CH(—$C_2H_5$)—$C_4H_9$ |
| 96 | 1 | 3 | 1 | 4 | H | —$C_3H_6$—$OCH_2$—CH(—$C_2H_5$)—$C_4H_9$ |
| 97 | 1 | 3 | 1 | 1 | H | —$C_2H_4OC_2H_4OC_2H_5$ |
| 98 | 1 | 3 | 1 | 2 | —$C_2H_5$ | —$C_2H_4OC_2H_5$ |
| 99 | 1 | 3 | 3 | 3 | —i-$C_3H_7$ | —$CH_2$O—$C_2H_4$—(1,3-dioxane) |
| 100 | 1 | 3 | 1 | 4 | H | —CH($C_2H_5$)—$CH_2OCH_3$ |
| 101 | 1 | 3 | 1 | 1 | H | —CH($C_2H_5$)—$CH_2OC_2H_4OC_2H_5$ |
| 102 | 1 | 3 | 4 | 2 | H | —CH($C_2H_5$)—$CH_2OC_2H_4OC_2H_5$ |
| 103 | 1 | 3 | 4 | 3 | H | —CH($C_2H_5$)—$CH_2OC_2H_4OC_2H_5$ |
| 104 | 1 | 3 | 4 | 3 | H | —CH($C_2H_5$)—$CH_2OC_2H_4OC_2H_5$ |
| 105 | 1 | 3 | 1 | 1 | H | —$CH_2$—$C_2H_4COCH_3$ |
| 106 | 1 | 3 | 2 | 2 | H | —$CH_2$—$C_2H_4COCH_3$ |
| 107 | 1 | 3 | 3 | 3 | H | —$CH_2$—$C_2H_4COC_3H_7$ |
| 108 | 1 | 3 | 1 | 4 | H | —$CH_2$—$C_2H_4COC_3H_7$ |
| 109 | 1 | 3 | 1 | 1 | —n-$C_8H_{17}$ | —CH($C_2H_5$)—$CH_2OC_2H_4OC_2H_5$ |
| 110 | 1 | 3 | 2 | 2 | H | —CH(—$COOC_2H_4OC_2H_5$)—$COOC_2H_4OC_2H_5$ |
| 111 | 1 | 3 | 1 | 3 | —$C_2H_4OC_2H_4OC_2H_5$ | —$C_2H_4OC_2H_4OC_2H_5$ |
| 112 | 0 | 4 | 1 | 1 | H | —$C_2H_4OC_2H_5$ |
| 113 | 0 | 4 | 1 | 2 | H | —$C_2H_4OC_2H_5$ |
| 114 | 0 | 4 | 1 | 3 | H | —$C_2H_4OC_2H_5$ |
| 115 | 0 | 4 | 1 | 4 | H | —$C_2H_4OC_2H_5$ |
| 116 | 0 | 4 | 1 | 4 | —$C_2H_4OC_2H_5$ | —$C_2H_4OC_2H_5$ |
| 117 | 0 | 4 | 1 | 1 | H | —$C_3H_6OC_4H_9$ |
| 118 | 0 | 4 | 1 | 2 | H | —$C_3H_6OC_4H_9$ |
| 119 | 0 | 4 | 1 | 3 | H | —$C_3H_6OC_4H_9$ |
| 120 | 0 | 4 | 1 | 4 | H | —$C_3H_6OC_4H_9$ |

-continued

| | Number of benzene | Number of N (pyridine) | m | n | R¹ | R² |
|---|---|---|---|---|---|---|
| 121 | 0 | 4 | 1 | 1 | —C₂H₄OCH₃ | —C₂H₄OCH₃ |
| 122 | 0 | 4 | 1 | 2 | —C₂H₄OCH₃ | —C₂H₄OCH₃ |
| 123 | 0 | 4 | 1 | 3 | —C₂H₄OCH₃ | —C₂H₄OCH₃ |
| 124 | 0 | 4 | 1 | 4 | —C₂H₄OCH₃ | —C₂H₄OCH₃ |
| 125 | 0 | 4 | 1 | 1 | —C₄H₉ | —C₄H₉ |
| 126 | 0 | 4 | 1 | 1 | H | —CH₂—CH(C₂H₅)—C₄H₉ |
| 127 | 0 | 4 | 1 | 2 | H | —CH₂—CH(C₂H₅)—C₄H₉ |
| 128 | 0 | 4 | 1 | 3 | H | —CH₂—CH(C₂H₅)—C₄H₉ |
| 129 | 0 | 4 | 1 | 4 | H | —CH₂—CH(C₂H₅)—C₄H₉ |
| 130 | 0 | 4 | 1 | 1 | H | —CHCOCH₃ |
| 131 | 0 | 4 | 1 | 2 | H | —CHCOCH₃ |
| 132 | 0 | 4 | 1 | 3 | H | —CHCOOC₃H₇ |
| 133 | 0 | 4 | 1 | 4 | H | —CHCOOC₃H₇ |
| 134 | 0 | 4 | 1 | 2 | H | —C₂H₄OC₂H₄OC₂H₅ |
| 135 | 0 | 4 | 1 | 3 | —C₂H₅ | —C₂H₄OC₂H₅ |
| 136 | 0 | 4 | 1 | 4 | —i-C₃H₇ | —CH₂O—C₂H₄—(1,3-dioxane) |
| 137 | 0 | 4 | 1 | 1 | H | |
| 138 | 0 | 4 | 1 | 1 | H | —CH(C₂H₅)—CH₂OC₂H₄OC₂H₅ |
| 139 | 0 | 4 | 1 | 2 | H | —CH(C₂H₅)—CH₂OC₂H₄OC₂H₅ |
| 140 | 0 | 4 | 1 | 3 | H | —CH(C₂H₅)—CH₂OC₂H₄OC₂H₅ |
| 141 | 0 | 4 | 1 | 4 | H | —CH(C₂H₅)—CH₂OC₂H₄OC₂H₅ |
| 142 | 0 | 4 | 1 | 1 | H | —CH(i-C₃H₇)—COOCH₃ |
| 143 | 0 | 4 | 1 | 2 | H | —CH(i-C₃H₇)—COOCH₃ |
| 144 | 0 | 4 | 1 | 3 | H | —CH(i-C₃H₇)—COOCH₃ |
| 145 | 0 | 4 | 1 | 4 | H | —CH(i-C₃H₇)—COOCH₃ |

-continued

| | Number of ⌬ | Number of (N-pyridine) | m | n | R¹ | R² |
|---|---|---|---|---|---|---|
| 146 | 0 | 4 | 1 | 2 | —n-C$_8$H$_{17}$ | —CH(C$_2$H$_5$)—CH$_2$OC$_2$H$_4$OC$_2$H$_5$ |
| 147 | 0 | 4 | 1 | 3 | H | —CH(COOC$_2$H$_4$OC$_2$H$_5$)—COOC$_2$H$_4$OC$_2$H$_5$ |
| 148 | 0 | 4 | 1 | 4 | —C$_2$H$_4$OC$_2$H$_4$OC$_2$H$_5$ | —C$_2$H$_4$OC$_2$H$_4$OC$_2$H$_5$ |
| 149 | 3 | 1 | 1 | 4 | —C$_{10}$H$_{21}$ | H |
| 150 | 3 | 1 | 1 | 3 | —C$_{12}$H$_{25}$ | —C$_{12}$H$_{25}$ |
| 151 | 3 | 1 | 1 | 4 | —C$_{12}$H$_{25}$ | —C$_2$H$_4$OC$_2$H$_5$ |
| 152 | 3 | 1 | 1 | 1 | —CH(C$_2$H$_5$)CH$_2$OC$_2$H$_4$OC$_2$H$_4$OCH$_3$ | H |
| 153 | 3 | 1 | 1 | 3 | —CH(C$_2$H$_5$)CH$_2$OC$_2$H$_4$OC$_2$H$_4$OC$_2$H$_5$ | —C$_2$H$_5$ |
| 154 | 3 | 1 | 1 | 1 | —CH(C$_4$H$_9$)CH$_2$OC$_2$H$_4$OC$_2$H$_4$OC$_2$H$_5$ | H |
| 155 | 3 | 1 | 1 | 1 | —CH(C$_2$H$_5$)CH$_2$OC$_2$H$_4$OC$_2$H$_4$OC$_4$H$_9$ | H |
| 156 | 3 | 1 | 1 | 2 | —CH(C$_2$H$_5$)CH$_2$OC$_2$H$_4$OC$_2$H$_4$OC$_2$H$_4$OCH$_3$ | H |
| 157 | 3 | 1 | 1 | 3 | —CH(C$_2$H$_5$)CH$_2$OC$_2$H$_4$OC$_2$H$_4$OC$_2$H$_4$OC$_2$H$_5$ | H |

[Dye Compound Represented by the Formula (II)]

Next, a dye compound represented by the following formula (II) will be described.

In the formula (II), $Rc_1$ is a halogen atom, an aliphatic group, an aryl group, a heterocyclic group, a cyano group, a carboxyl group, a carbamoyl group, an aliphatic oxycarbonyl

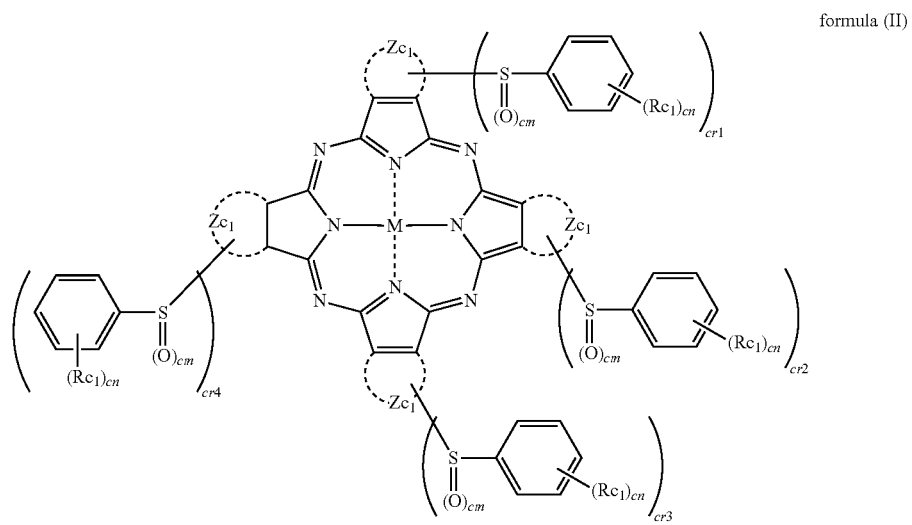

formula (II)

group, an aryloxycarbonyl group, an acyl group, a hydroxyl group, an aliphatic oxy group, an aryloxy group, acyloxy group, a carbamoyloxy group, a heterocyclic oxy group, an aliphatic oxycarbonyloxy group, an N-alkylacylamino group, a carbamoyl amino group, a sulfamoylamino group, an aliphatic oxycarbonylamino group, an aryloxycarbonylamino group, an aliphatic sulfonylamino group, an arylsulfonylamino group, an aliphatic thio group, an arylthio group, an aliphatic sulfonyl group, an arylsulfonyl group, a sulfamoyl group, a sulfo group, an imido group or a heterocyclic thio group.

$Zc_1$ is a nonmetal atom group required in forming a 6-membered ring together with carbon atoms, and four $Zc_1$s may be identical with or different from each other.

M is two hydrogen atoms, a divalent metal atom, a divalent metal oxide, a divalent metal hydroxide or a divalent metal chloride.

cm is 0, 1 or 2, cn is 0 or an integer of 1 to 5, and four cn's may be identical with or different from each other. One cn is an integer of 1 to 5, and a plurality of $Rc_1$s in a molecule may be identical with or different from each other cr1, cr2, cr3 and cr4 are 0 or 1, and $cr1+cr2+cr3+cr4 \geqq 1$ is satisfied.

In the formula (II), the aliphatic portion of "aliphatic" may be straight-chained, branched or cyclic and may be saturated or unsaturated. Examples of "aliphatic" include an alkyl group, alkenyl group, cycloalkyl group and cycloalkenyl group, and "aliphatic" may be unsubstituted or substituted with a substituent. Moreover, "aryl" may be any one of a monocyclic ring or a condensed ring, and may be unsubstituted or substituted with a substituent. The heterocyclic portion of a "heterocyclic ring" contains a hetero atom (e.g., a nitrogen atom, a sulfur atom and an oxygen atom) in a ring, and may be any one of a saturated ring or an unsaturated ring. The "heterocyclic ring" may be any one of a monocyclic ring or a condensed ring, and may be unsubstituted or substituted with a substituent.

In the formula (II), the "substituent" may be a group capable of substitution. Examples thereof include an aliphatic group, an aryl group, a heterocyclic group, an acyl group, an imido group, an azo group, an acyloxy group, an acylamino group, an N-alkylacylamino group, an aliphatic oxy group, an aryloxy group, a heterocyclic oxy group, an aliphatic oxycarbonyl group, an aryloxycarbonyl group, a heterocyclic-oxycarbonyl group, a carbamoyl group, an aliphatic sulfonyl group, an arylsulfonyl group, a heterocyclic sulfonyl group, an aliphatic sulfonyloxy group, an arylsulfonyloxy group, a heterocyclic sulfonyloxy group, a sulfamoyl group, an aliphatic sulfonamide group, an arylsulfonamide group, a heterocyclic sulfonamide group, an amino group, an aliphatic amino group, an arylamino group, a heterocyclic amino group, an aliphatic oxycarbonylamino group, an aryloxycarbonylamino group, a heterocyclic-oxycarbonylamino group, an aliphatic sulfinyl group, an arylsulfinyl group, an aliphatic thio group, an arylthio group, a heterocyclic thio, a hydroxyl group, a cyano group, a sulfo group, a carboxyl group, an aliphatic oxyamino group, an aryloxyamino group, a carbamoylamino group, a sulfamoylamino group, a halogen atom, a sulfamoylcarbamoyl group, a carbamoylsulfamoyl group, a dialiphatic oxyphosphinyl group and a diaryloxyphosphinyl group.

In the formula (II), $Rc_1$ is a halogen atom, an aliphatic group, an aryl group, a heterocyclic group, a cyano group, a carboxyl group, a carbamoyl group, an aliphatic oxycarbonyl group, an aryloxycarbonyl group, an acyl group, a hydroxyl group, an aliphatic oxy group, an aryloxy group, acyloxy group, a carbamoyloxy group, a heterocyclic oxy group, an aliphatic oxycarbonyloxy group, an N-alkylacylamino group, a carbamoylamino group, a sulfamoylamino group, an aliphatic oxycarbonylamino group, an aryloxycarbonylamino group, an aliphatic sulfonylamino group, an arylsulfonylamino group, an aliphatic thio group, an aryl thio group, an aliphatic sulfonyl group, an arylsulfonyl group, a sulfamoyl group, a sulfo group, an imido group or a heterocyclic thio group.

Examples of the halogen group represented by $Rc_1$ include a fluorine atom, a chlorine atom and a bromine atom.

The aliphatic group represented by $Rc_1$ may be unsubstituted or substituted with a substituent. The aliphatic group may be saturated or unsaturated, and may be cyclic. As the aliphatic group, an aliphatic group having 1 to 15 carbon atoms is preferred, and examples thereof include methyl group, ethyl group, vinyl group, allyl group, ethynyl group, isopropenyl group and 2-ethylhexyl group.

The aryl group represented by $Rc_1$ may be unsubstituted or substituted with a substituent. As the aryl group, an aryl group having 6 to 16 carbon atoms is preferred and an aryl group having 6 to 12 carbon atoms is more preferred. Examples thereof include phenyl group, 4-nitrophenyl group, 2-nitrophenyl group, 2-chlorophenyl group, 2,4-dichlorophenyl group, 2,4-dimethylphenyl group, 2-methylphenyl group, 4-methoxyphenyl group, 2-methoxyphenyl group and 2-methoxycarbonyl-4-nitrophenyl group.

The heterocyclic group represented by $Rc_1$ may be saturated or unsaturated. As the heterocyclic group, a heterocyclic group having 1 to 15 carbon atoms is preferred, and a heterocyclic group having 3 to 10 carbon atoms is more preferred. Examples thereof include 3-pyridyl group, 2-pyridyl group, 2-pyrimidinyl group, 2-pyrazinyl group and 1-piperidinyl group. Moreover, the heterocyclic group may further have a substituent.

The carbamoyl group represented by $Rc_1$ may be unsubstituted or substituted with a substituent. As the carbamoyl group, a carbamoyl group having 1 to 16 carbon atoms is preferred, and a carbamoyl group having 1 to 12 carbon atoms is more preferred. Examples thereof include carbamoyl group, dimethylcarbamoyl group and dimethoxyethylcarbamoyl group.

The aliphatic oxycarbonyl group represented by $Rc_1$ may be unsubstituted or substituted with a substituent. The aliphatic oxycarbonyl group may be saturated or unsaturated, and may be cyclic. As the aliphatic oxycarbonyl group, an aliphatic oxycarbonyl group having 2 to 16 carbon atoms is preferred, and an aliphatic oxycarbonyl group having 2 to 10 carbon atoms is more preferred. Examples thereof include methoxycarbonyl group and butoxycarbonyl group.

The aryloxycarbonyl group represented by $Rc_1$ may be unsubstituted or substituted with a substituent. As the aryloxycarbonyl group, an aryloxycarbonyl group having 7 to 17 carbon atoms is preferred, and an aryloxycarbonyl group having 7 to 15 carbon atoms is more preferred. Examples thereof include phenoxycarbonyl group.

The acyl group represented by $Rc_1$ may be an aliphatic carbonyl group or an arylcarbonyl group. When the acyl group is an aliphatic carbonyl group, the acyl group may further have a substituent. When the acyl group is an arylcarbonyl group, the acyl group may further have a substituent. The acyl group may be saturated or unsaturated, and may be cyclic. As the acyl group, an acyl group having 2 to 15 carbon atoms is preferred, and an acyl group having 2 to 10 carbon atoms is more preferred. Examples thereof include acetyl group, pivaloyl group and benzoyl group. Moreover, the acyl group may further have a substituent.

The aliphatic oxy group represented by $Rc_1$ may be unsubstituted or substituted with a substituent. The aliphatic oxy group may be saturated or unsaturated, and may be cyclic. As the aliphatic oxy group, an aliphatic oxy group having 1 to 12 carbon atoms is preferred, and an aliphatic oxy group having 1 to 10 carbon atoms is more preferred. Examples thereof include methoxy group, ethoxyethoxy group, phenoxyethoxy group and thiophenoxyethoxy group.

The aryloxy group represented by $Rc_1$ may be unsubstituted or substituted with a substituent. As the aryloxy group, an aryloxy group having 6 to 18 carbon atoms is preferred, and an aryloxy group having 6 to 14 carbon atoms is more preferred. Examples thereof include phenoxy group and 4-methylpheoxy group.

The acyloxy group represented by $Rc_1$ may be unsubstituted or substituted with a substituent. As the acyloxy group, an acyloxy group having 2 to 14 carbon atoms is preferred, and an acyloxy group having 2 to 10 carbon atoms is more preferred. Examples thereof include acetoxy group, methoxyacetoxy group and benzoyloxy group.

The carbamoyloxy group represented by $Rc_1$ may be unsubstituted or substituted with a substituent. As the carbamoyloxy group, a carbamoyloxy group having 1 to 16 carbon atoms is preferred, and a carbamoyloxy group having 1 to 12 carbon atoms is more preferred. Examples thereof include dimethylcarbamoyloxy group and diisopropylcarbamoyloxy group.

The heterocyclic oxy group represented by $Rc_1$ may be unsubstituted or substituted with a substituent. As the heterocyclic oxy group, a heterocyclic oxy group having 1 to 15 carbon atoms is preferred, and a heterocyclic oxy group having 3 to 10 carbon atoms is more preferred. Examples thereof include 3-furyloxy group, 3-pyridyloxy group and N-methyl-2-piperidyloxy group.

The aliphatic oxycarbonyloxy group represented by $Rc_1$ may be unsubstituted or substituted with a substituent. The aliphatic oxycarbonyloxy group may be saturated or unsaturated, and may be cyclic. As the aliphatic oxycarbonyloxy group, an aliphatic oxycarbonyloxy group having 2 to 16 carbon atoms is preferred, and an aliphatic oxycarbonyloxy group having 2 to 10 carbon atoms is more preferred. Examples thereof include methoxycarbonyloxy group and (t)-butoxycarbonyloxy group.

The N-alkylacylamino group represented by $Rc_1$ may be unsubstituted or substituted with a substituent. As the N-alkylacylamino group, an N-alkylacylamino group having 3 to 15 carbon atoms is preferred, and an N-alkylacylamino group having 3 to 12 carbon atoms is more preferred. Examples thereof include N-methylacetylamino group, N-ethoxyethylbenzoylamino group and N-methylmethoxyacetylamino group.

The carbamoylamino group represented by $Rc_1$ may be unsubstituted or substituted with a substituent. As the carbamoylamino group, a carbamoylamino group having 1 to 16 carbon atoms is preferred, and a carbamoylamino group having 1 to 12 carbon atoms is more preferred. Examples thereof include N,N-dimethylcarbamoylamino group and N-methyl-N-methoxyethylcarbamoylamino group.

The sulfamoylamino group represented by $Rc_1$ may be unsubstituted or substituted with a substituent. As the sulfamoylamino group, a sulfamoylamino group having 0 to 16 carbon atoms is preferred, and a sulfamoylamino group having 0 to 12 carbon atoms is more preferred. Examples thereof include N,N-dimethylsulfamoylamino group and N,N-diehtylsulfamoyl group.

The aliphatic oxycarbonylamino group represented by $Rc_1$ may be unsubstituted or substituted with a substituent. As the aliphatic oxycarbonylamino group, an aliphatic oxycarbonylamino group having 2 to 15 carbon atoms is preferred, and an aliphatic oxycarbonylamino group having 2 to 10 carbon atoms is more preferred. Examples thereof include methoxycarbonylamino group and methoxyethoxycarbonylamino group.

The aryloxycarbonylamino group represented by $Rc_1$ may be unsubstituted or substituted with a substituent. As the aryloxycarbonylamino group, an aryloxycarbonylamino group having 7 to 17 carbon atoms is preferred, and an aryloxycarbonylamino group having 7 to 15 carbon atoms is more preferred. Examples thereof include phenoxycarbonylamino group and 4-methoxycarbonylamino group.

The aliphatic sulfonylamino group represented by $Rc_1$ may be unsubstituted or substituted with a substituent. The aliphatic sulfonylamino group may be saturated or unsaturated, and may be cyclic. As the aliphatic sulfonylamino group, an aliphatic sulfonylamino group having 1 to 12 carbon atoms is preferred, and an aliphatic sulfonylamino group having 1 to 8 carbon atoms is more preferred. Examples thereof include methanesulfonylamino group and butanesulfonylamino group.

The arylsulfonylamino group represented by $Rc_1$ may be unsubstituted or substituted with a substituent. As the arylsulfonylamino group, an arylsulfonylamino group having 6 to 15 carbon atoms is preferred, and an arylsulfonylamino group having 6 to 12 carbon atoms is more preferred. Examples thereof include benzenesulfonylamino group and 4-toluenesulfonylamino group.

The aliphatic thio group represented by $Rc_1$ may be unsubstituted or substituted with a substituent. The aliphatic thio group may be saturated or unsaturated, and may be cyclic. As the aliphatic thio group, an aliphatic thio group having 1 to 16 carbon atoms is preferred, and an aliphatic thio group having 1 to 10 carbon atoms is more preferred. Examples thereof include methylthio group, ethylthio group and ethoxyehtylthio group.

The arylthio group represented by $Rc_1$ may be unsubstituted or substituted with a substituent. As the arylthio group, an arylthio group having 6 to 22 carbon atoms is preferred, and an arylthio group having 6 to 14 carbon atoms is more preferred. Examples thereof include phenylthio group and 2-t-butylthio group.

The aliphatic sulfonyl group represented by $Rc_1$ may be unsubstituted or substituted with a substituent. As the aliphatic sulfonyl group, an aliphatic sulfonyl group having 1 to 15 carbon atoms is preferred, and an aliphatic sulfonyl group having 1 to 8 carbon atoms is more preferred. Examples thereof include methanesulfonyl group, butanesulfonyl group and methoxyethanesulfonyl group.

The arylsulfonyl group represented by $Rc_1$ may be unsubstituted or substituted with a substituent. As the arylsulfonyl group, an arylsulfonyl group having 6 to 16 carbon atoms is preferred, and an arylsulfonyl group having 6 to 12 carbon atoms is more preferred. Examples thereof include benzenesulfonyl group, 4-t-butylbenzenesulfonyl group, 4-toluenesulfonyl group and 2-toluenesulfonyl group.

The sulfamoyl group represented by $Rc_1$ may be unsubstituted or substituted with a substituent. As the sulfamoyl group, a sulfamoyl group having 0 to 16 carbon atoms is preferred, and a sulfamoyl group having 0 to 12 carbon atoms is more preferred. Examples thereof include sulfamoyl group and dimethylsulfamoyl group.

The imido group represented by $Rc_1$ may be unsubstituted or substituted with a substituent. As the imido group, an imido group having 3 to 22 carbon atoms is preferred, and an imido group having 3 to 15 carbon atoms is more preferred. Examples thereof include succinimido group and phthalimido group.

Furthermore, cr1, cr2, cr3 and cr4 are 0 or 1, and cr1+cr2+cr3+cr4≧1 is satisfied. Among these, cr1+cr2+cr3+cr4 in a form of 3 or 4 is preferred.

Among the dye compounds represented by the formula (II), a dye represented by the following formula (II-1) is preferred in the viewpoint of obtaining the effect of the invention even more effectively.

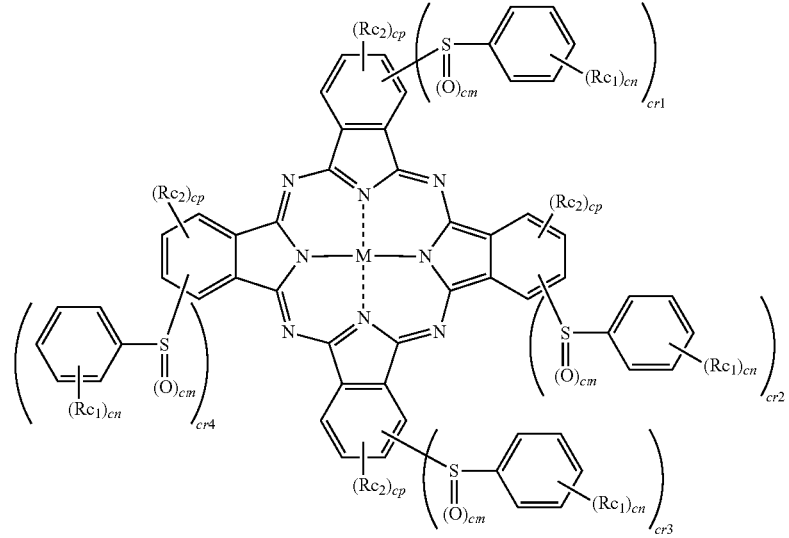

formula (II-1)

The heterocyclic thio group represented by $Rc_1$ may be unsubstituted or substituted with a substituent. As the heterocyclic thio group, a 5 to 7-membered heterocyclic thio group having 1 to 20 carbon atoms is preferred, and a 5 to 7-membered heterocyclic thio group having 1 to 12 carbon atoms is more preferred. Examples thereof include 3-furylthio group and 3-pyridylthio group.

In the formula (II), $Zc_1$ is a nonmetal atom group required for forming a 6-membered ring together with carbon atoms, and four $Zc_1$s may be identical with or different from each other. The 6-membered ring, which is formed, may be any one of an aryl ring or a heterocyclic ring. The 6-membered ring may be condensed, and the condensed ring may be further substituted with a substituent. Examples of the 6-membered ring include benzene ring, pyridine ring, cyclohexene ring and naphthalene ring, and a form of the benzene ring is preferred.

In the formula (II), M is two hydrogen atoms, a divalent metal atom, a divalent metal oxide, a divalent metal hydroxide or a divalent metal chloride. Examples of M include VO, TiO, Zn, Mg, Si, Sn, Rh, Pt, Pd, Mo, Mn, Pb, Cu, Ni, Co, Fe, AlCl, InCl, FeCl, $TiCl_2$, $SnCl_2$, $SiCl_2$, $GeCl_2$, $Si(OH)_2$ and $H_2$, and a form of VO, Zn, Mn, Cu, Ni, Co is preferred.

In the formula (II), cm is 0, 1 or 2 (preferably 0), and cn is 0 or an integer from 1 to 5 (preferably 0 or 1). Four cn's in a molecule may be identical with or different from each other; while one cn is an integer from 1 to 5, and when there are a plurality of $Rc_1$s in a molecule, the plurality of $Rc_1$s may be identical with or different from each other.

In the formula (II-1), $Rc_2$ is a substituent. The substituent is acceptable as long as the group is capable of substitution, and the groups exemplified in the paragraph of "substituents" of the above-mentioned formula (II) can be mentioned.

Such substituents are preferably an aliphatic group, an aryl group, a heterocyclic group, a N-alkylacylamino group, an aliphatic oxy group, an aryloxy group, a heterocyclic oxy group, an aliphatic oxycarbonyl group, an aryloxycarbonyl group, a heterocyclic-oxycarbonyl group, a carbamoyl group, an aliphatic sulfonyl group, a sulfamoyl group, an aliphatic sulfonamide group, an arylsulfonamide group, an aliphatic amino group, an arylamino group, an aliphatic oxycarbonylamino group, an aryloxycarbonylamino group, an aliphatic thio group, an arylthio group, a hydroxyl group, a cyano group, a sulfo group, a carboxyl group, a carbamoylamino group, a sulfamoylamino group and a halogen atom, and more preferably, an aliphatic group, a N-alkylacylamino group, an aliphatic oxy group, an aliphatic oxycarbonyl group, an aliphatic sulfonyl group, an aliphatic thio group, an arylthio group, a sulfo group, a carboxyl group and a halogen atom.

In the formula (II-1), cp is an integer of 0 to 4, and preferably 0 or 1; while cp+cr1, cp+cr2, cp+cr3 and cp+cr4 are integers of 0 to 4. When there is a plurality of $Rc_2$'s in a molecule, the plurality of $Rc_2$'s may be identical with or different from each other.

Further, in the formula (II-1), $Rc_1$, M, cm, cn, cr1, cr2, cr3 and cr4 have the same definitions as in the formula (II), and preferable forms also have the same definitions.

Among the dye compound represented by the formula (II-1), a dye represented by the following formula (II-2) is more preferred in the viewpoint of obtaining the effect of the invention even more effectively.

formula (II-2)

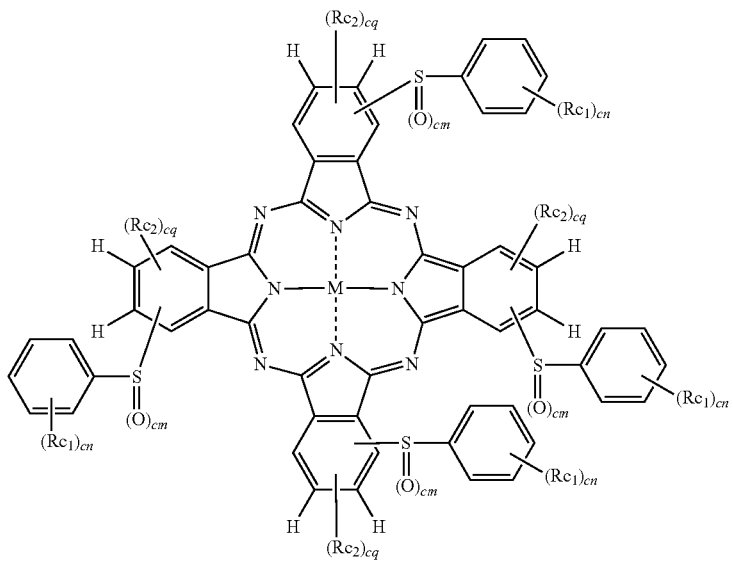

In the formula (II-2), Rc1, Rc2, M, cm and cn, have the same definitions as in the formulas (II) and (II-1), respectively, and the preferable forms also have the same definitions. In the formula (II-2), cq is 0 or 1. The phthalocyanine skeleton has a structure in which four benzene rings are condensed to the outside of the tetraazaporphyrin skeleton. Each benzene ring has four sites (carbon atoms) where substituents can be substituted, but the formula (II-2) has hydrogen atoms bound to the two sites (β position) far from the tetraazaporphyrin skeleton of each benzene ring.

In the formula (II-2), from the viewpoint of exhibiting the effect of the invention more effectively, an embodiment wherein $Rc_1$ is a halogen atom, aliphatic group, cyano group, carbamoyl group, aliphatic oxycarbonyl group, aryloxycarbonyl group, hydroxyl group, aliphatic oxy group, carbamoyloxy group, heterocyclic oxy group, aliphatic oxycarbonyloxy group, carbamoylamino group, sulfamoylamino group, aliphatic oxycarbonylamino group, aliphatic sulfonylamino group, arylsulfonylamino group, aliphatic thio group, arylthio group, aliphatic sulfonyl group, arylsulfonyl group, sulfamoyl group, imido group or sulfo group, is preferred, an embodiment wherein $Rc_1$ is aliphatic group, carbamoyl group, aliphatic oxycarbonyl group, aryloxycarbonyl group, aliphatic oxy group, aliphatic oxycarbonyloxy group, carbamoylamino group, sulfamoylamino group, aliphatic oxycarbonylamino group, aliphatic sulfonylamino group, arylsulfonylamino group, aliphatic sulfonyl group, arylsulfonyl group, sulfamoyl group, imido group or sulfo group, is more preferred, and an embodiment wherein $Rc_1$ is carbamoyl group, aliphatic oxycarbonyl group, aliphatic oxy group, aliphatic oxycarbonyloxy group, carbamoylamino group, aliphatic oxycarbonylamino group, arylsulfonyl group, imido group or aliphatic sulfonyl group, is the most preferred.

Similarly, from the viewpoint of exhibiting the effect of the invention more effectively, an embodiment wherein $Rc_2$ is an aliphatic group, N-alkylacylamino group, aliphatic oxy group, aliphatic oxycarbonyl group, aliphatic sulfonyl group, aliphatic thio group, arylthio group, sulfo group, carboxyl group or a halogen atom, is preferred, and an embodiment wherein $Rc_2$ is an aliphatic group or a halogen atom, is more preferred. Similarly, from the viewpoint of exhibiting the effect of the invention more effectively, an embodiment wherein cq is 0, is preferred. Further similarly, from the viewpoint of exhibiting the effect of the invention more effectively, an embodiment wherein M is VO, Mn, Co, Ni, Cu, Zn or Mg, is preferred, an embodiment wherein M is VO, Co, Cu or Zn, is more preferred, and an embodiment wherein M is Cu, is the most preferred. In addition, an embodiment wherein cm is 0, is preferred, and an embodiment wherein cn is 1 or 2, is preferred and an embodiment wherein cn is 1, is more preferred.

From the viewpoint of exhibiting the effect of the invention even more effectively, in the formula (II-2), an embodiment wherein the $Rc_1$ is a halogen atom, aliphatic group, cyano group, carbamoyl group, aliphatic oxycarbonyl group, aryloxycarbonyl group, hydroxyl group, aliphatic oxy group, carbamoyloxy group, heterocyclic oxy group, aliphatic oxy carbonyloxy group, carbamoylamino group, sulfamoylamino group, aliphatic oxycarbonylamino group, aliphatic sulfonylamino group, arylsulfonylamino group, aliphatic-thio group, arylthio group, aliphatic sulfonyl group, arylsulfonyl group, sulfamoyl group, imido group or sulfo group; M is VO, Co, Cu or Zn; cq is 0; cm is 0; and cn is 1, is preferred. Moreover, an embodiment wherein $Rc_1$ is an aliphatic group, carbamoyl group, aliphatic oxycarbonyl group, aryloxycarbonyl group, aliphatic oxy group, aliphatic oxycarbonyloxy group, carbamoylamino group, sulfamoylamino group, aliphatic oxycarbonylamino group, aliphatic sulfonylamino group, arylsulfonylamino group, aliphatic sulfonyl group, arylsulfonyl group, sulfamoyl group, imido group or sulfo group; M is VO, Co, Cu or Zn; cq is 0; cm is 0; and cn is 1, is more preferred.

Similarly, the viewpoint of exhibiting the effect of the invention even more effectively, an embodiment wherein $Rc_1$ is a carbamoyl group, aliphatic oxycarbonyl group, aliphatic oxy group, carbamoylamino group, aliphatic oxycarbonylamino group, aliphatic sulfonyl group, arylsulfonyl group or imido group; M is Cu; cq is 0; cm is 0; and cn is 1, is the most preferred.

Specific examples of the dye represented by the formulas (II) to (II-2) (Exemplary compounds C-1 to C-59) are presented below, while the invention is not limited to these examples.

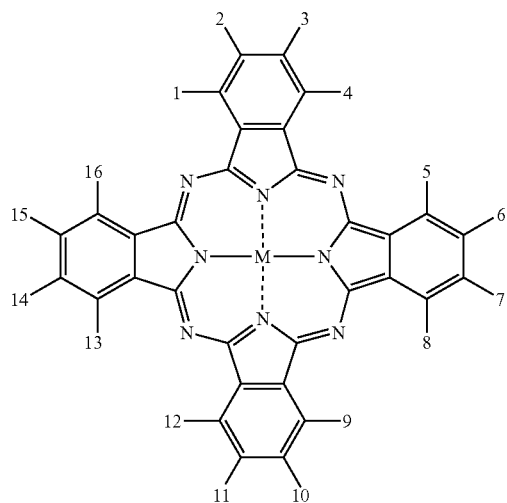
| Exemplary compound | M | Substituents at positions 1 or 4, 5 or 8, 9 or 12, and 13 or 16 (other four positions are occupied by H) | Substituents of the other eight positions |
|---|---|---|---|
| C-1 | Cu | 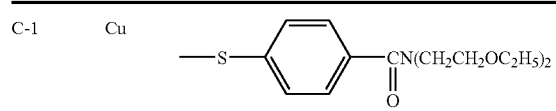 | H |
| C-2 | Cu | 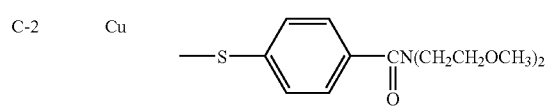 | H |
| C-3 | Cu | 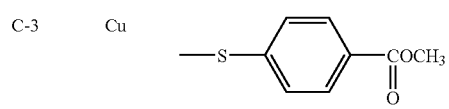 | H |
| C-4 | Cu | 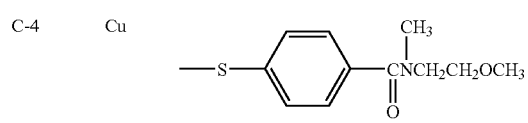 | H |
| C-5 | Cu | 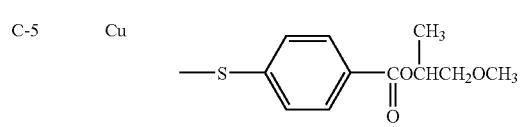 | H |
| C-6 | Cu | 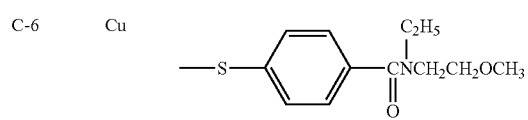 | H |
| C-7 | Cu | 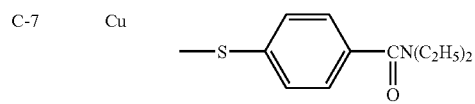 | H |
| C-8 | Cu | 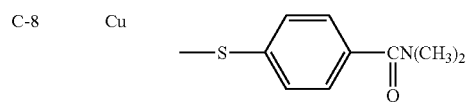 | H |

-continued

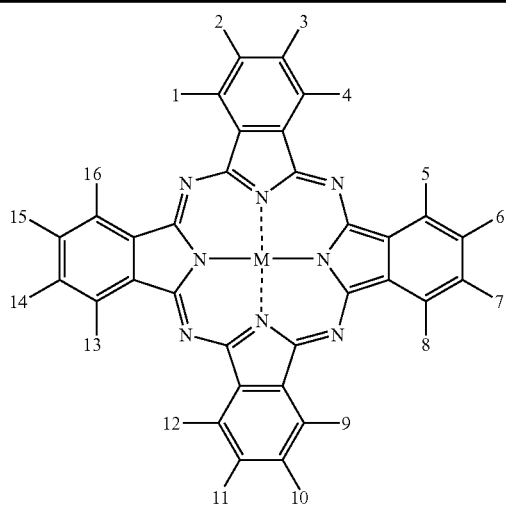

| Exemplary compound | M | Substituents at positions 1 or 4, 5 or 8, 9 or 12, and 13 or 16 (other four positions are occupied by H) | Substituents of the other eight positions |
|---|---|---|---|
| C-9 | Cu | —S—C$_6$H$_4$—COCH(CH$_3$)CH$_2$OCH$_3$ (with C=O) | H |
| C-10 | Cu | —S—C$_6$H$_4$—C(=O)N(CH$_2$CH$_2$OC$_2$H$_5$)$_2$ | H |
| C-11 | Cu | —S—C$_6$H$_4$—OCH$_2$CH$_2$OC$_2$H$_5$ | H |
| C-12 | Cu | —S—C$_6$H$_4$—SO$_2$CH$_2$CH$_2$OC$_2$H$_5$ | CH$_3$ groups at position 2 or 3, 6 or 7, 10 or 11, and 14 or 15, and H at other four positions |
| C-13 | Cu | —S(=O)$_2$—C$_6$H$_4$—C(=O)N(CH$_2$CH$_2$OC$_2$H$_5$)$_2$ | H |
| C-14 | Cu | —S—C$_6$H$_4$—C(=O)N(CH$_2$CH$_2$OC$_2$H$_5$)$_2$ (ortho) | H |
| C-15 | Cu | —S—C$_6$H$_4$—OC(=O)CH$_2$CH$_2$OC$_2$H$_5$ | CH$_3$ groups at position 2 or 3, 6 or 7, 10 or 11, and 14 or 15, and H at other four positions |

-continued

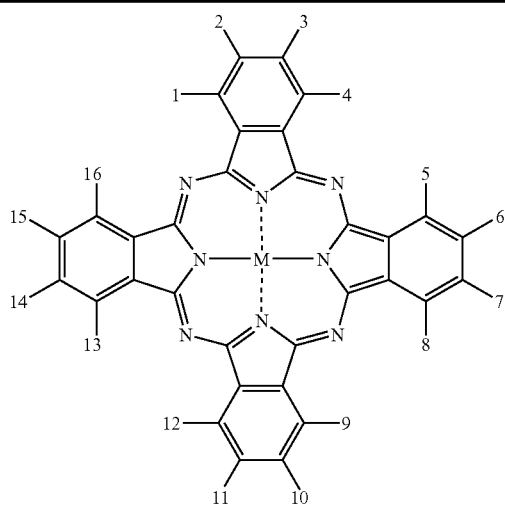

| Exemplary compound | M | Substituents at positions 1 or 4, 5 or 8, 9 or 12, and 13 or 16 (other four positions are occupied by H) | Substituents of the other eight positions |
|---|---|---|---|
| C-16 | Cu | —S—C$_6$H$_4$—NHCN(CH$_2$CH$_2$OC$_2$H$_5$)$_2$ (C=O) | H |
| C-17 | Cu | —S—C$_6$H$_4$—NHCOCH(CH$_3$)CH$_2$OCH$_3$ | H |
| C-18 | Cu | —S—C$_6$H$_3$(CH$_3$)—N(CH$_3$)COCH(CH$_3$)CH$_2$OCH$_3$ | H |
| C-19 | Cu | —S—C$_6$H$_4$—CO—O—C$_6$H$_2$(CH$_3$)$_3$ | H |
| C-20 | Cu | —S—C$_6$H$_4$—N(H)SO$_2$N(C$_2$H$_5$)$_2$ | H |
| C-21 | Cu | —S—C$_6$H$_4$—N(CH$_3$)SO$_2$CH$_3$ | H |
| C-22 | Cu | —S—C$_6$H$_4$—NHSO$_2$—C$_6$H$_5$ | H |
| C-23 | Cu | —S—C$_6$H$_4$—SO$_2$—C$_6$H$_4$—CH$_3$ | H |

-continued

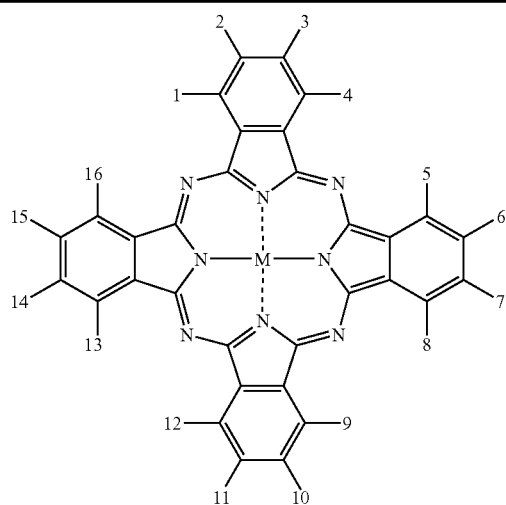

| Exemplary compound | M | Substituents at positions 1 or 4, 5 or 8, 9 or 12, and 13 or 16 (other four positions are occupied by H) | Substituents of the other eight positions |
|---|---|---|---|
| C-24 | Cu | —S—C₆H₄—SO₂N(CH₂CH₂OCH₃)₂ | H |
| C-25 | Cu | —S—C₆H₃(SO₃Na)(OCH₂CH₂OC₂H₅) | H |
| C-26 | V=O | —S—C₆H₄—C(O)N(CH₂CH₂OC₂H₅)₂ | H |
| C-27 | Co | —S—C₆H₄—C(O)N(CH₃)CH₂CH₂OCH₃ | H |
| C-28 | Co | —S—C₆H₄—C(O)N(CH₃)₂ | H |
| C-29 | Zn | —S—C₆H₄—NHC(O)CH(CH₃)CH₂OCH₃ | H |
| C-30 | V=O | —S—C₆H₄—OCH₂(CF₂)₃CF₂H | H |
| C-31 | Cu | —S—C₆H₃(Cl)(OCH₂CH₂OCH₂CH₂OCH₃) | H |

-continued
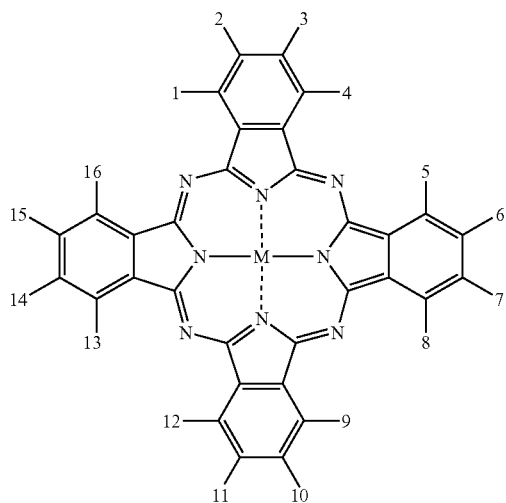
| Exemplary compound | M | Substituents at positions 1 or 4, 5 or 8, 9 or 12, and 13 or 16 (other four positions are occupied by H) | Substituents of the other eight positions |
|---|---|---|---|
| C-32 | Cu | 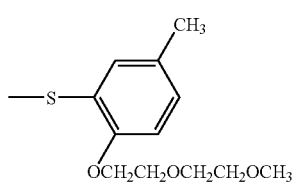 | H |
| C-33 | Cu | 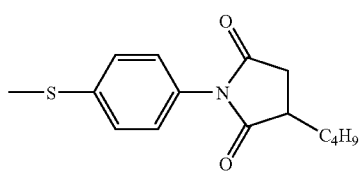 | H |
| C-34 | Cu | 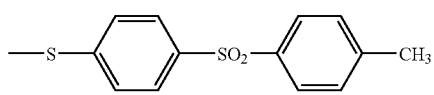 | H |
| C-35 | Cu | 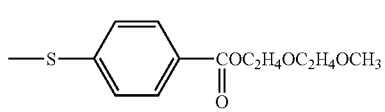 | H |
| C-41 | Cu | 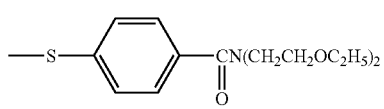 | H |
| C-42 | Cu | 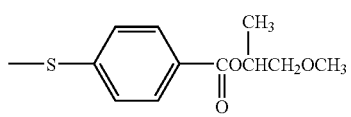 | H |
| C-43 | Cu | 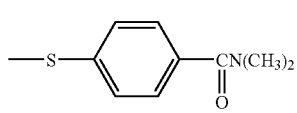 | H |

-continued
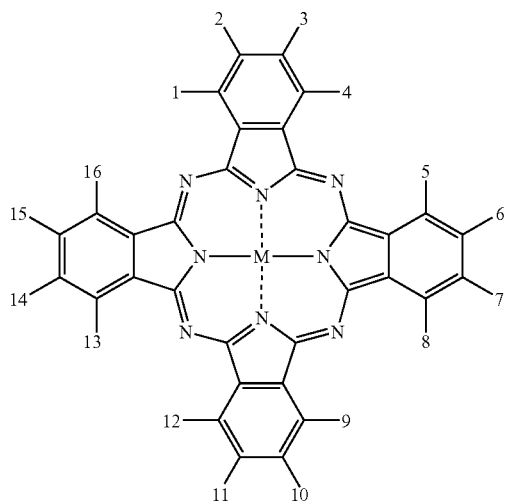
| Exemplary compound | M | Substituents at positions 1 or 4, 5 or 8, 9 or 12, and 13 or 16 (other four positions are occupied by H) | Substituents of the other eight positions |
|---|---|---|---|
| C-44 | Cu | 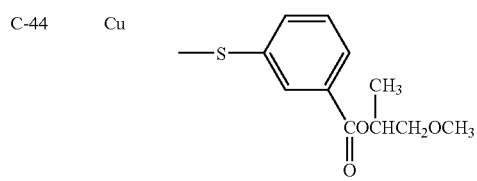 | H |
| C-45 | Co | 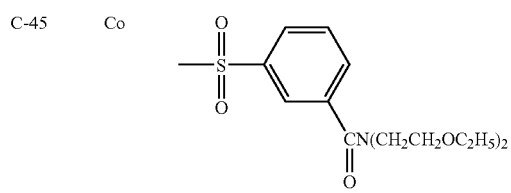 | H |
| C-46 | Zn | 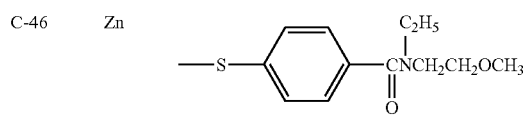 | H |
| C-47 | V=O | 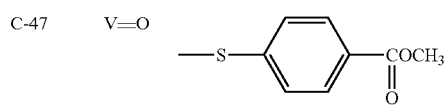 | H |
| C-48 | Cu | 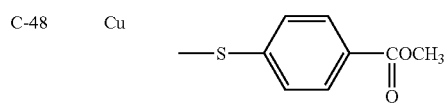 | $CH_3$ groups at position 1 or 4, 5 or 8, 9 or 12, and 13 or 16, and H at other four positions |
| C-49 | Cu | 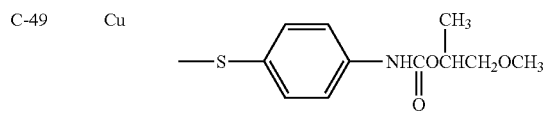 | H |

-continued
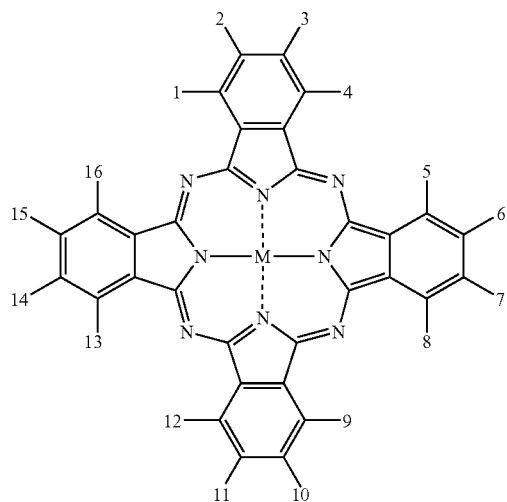
| Exemplary compound M | Substituents at positions 1 or 4, 5 or 8, 9 or 12, and 13 or 16 (other four positions are occupied by H) | Substituents of the other eight positions |
|---|---|---|
C-50
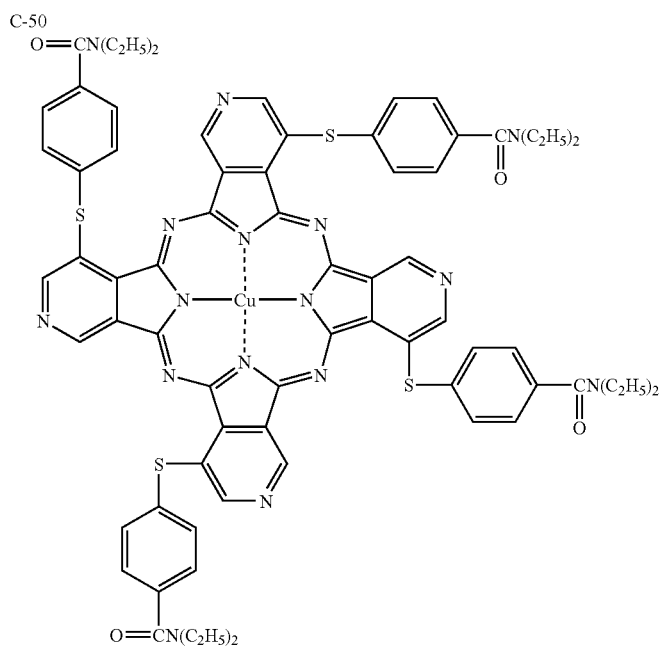

-continued
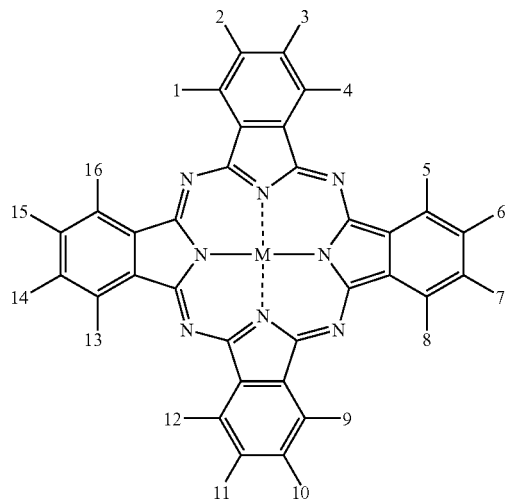
| Exemplary compound M | Substituents at positions 1 or 4, 5 or 8, 9 or 12, and 13 or 16 (other four positions are occupied by H) | Substituents of the other eight positions |
|---|---|---|
| C-51 | | |
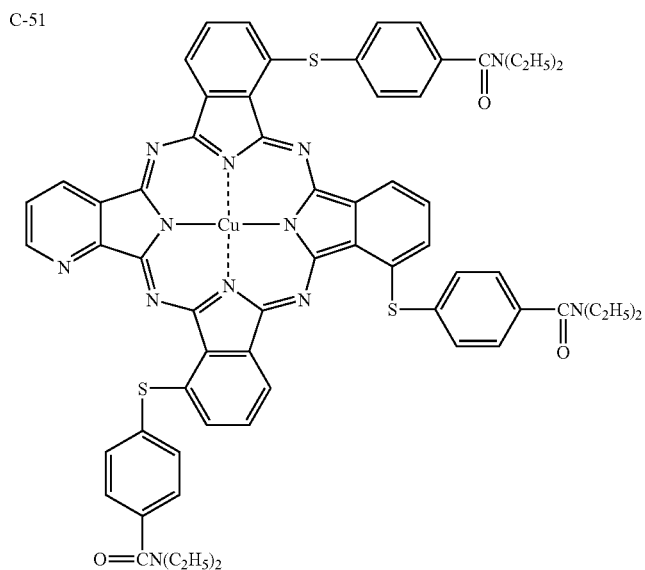

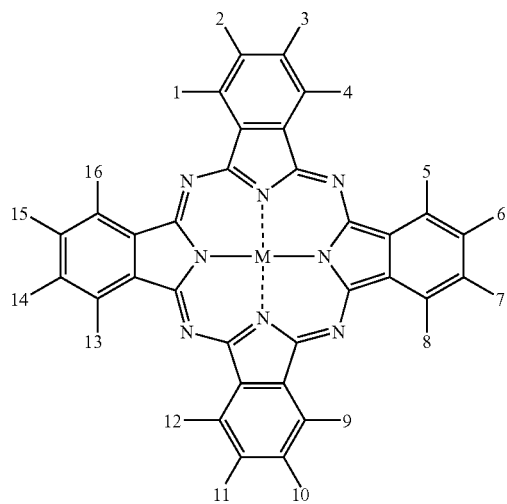
| Exemplary compound M | Substituents at positions 1 or 4, 5 or 8, 9 or 12, and 13 or 16 (other four positions are occupied by H) | Substituents of the other eight positions |
|---|---|---|
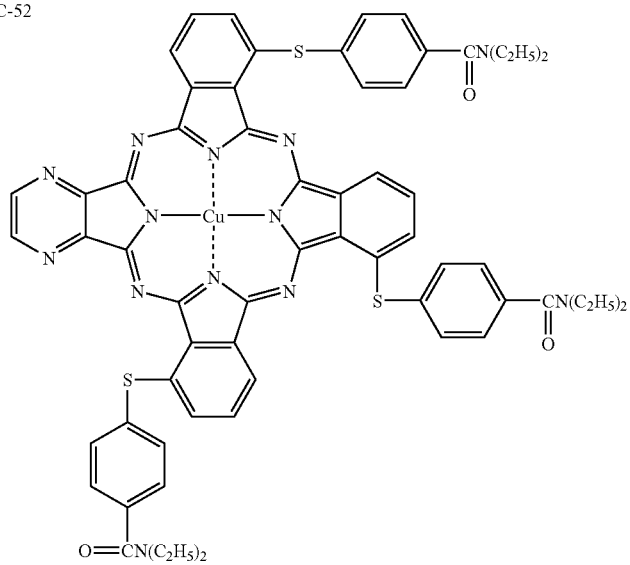
C-52

-continued
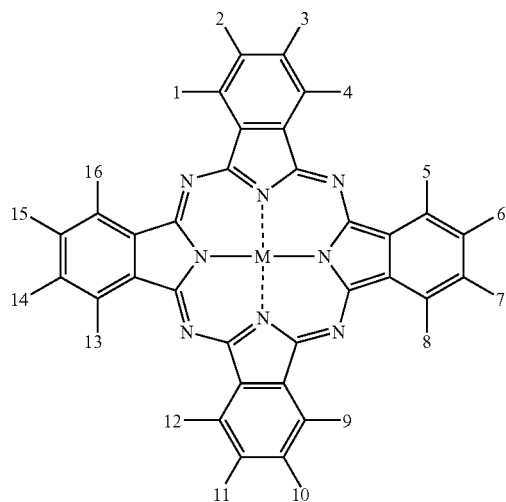
| Exemplary compound | M | Substituents at positions 1 or 4, 5 or 8, 9 or 12, and 13 or 16 (other four positions are occupied by H) | Substituents of the other eight positions |
|---|---|---|---|
C-53
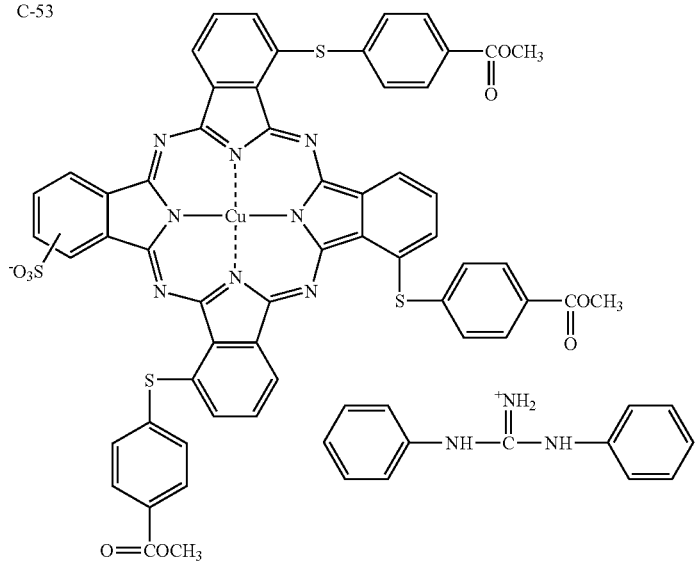

-continued
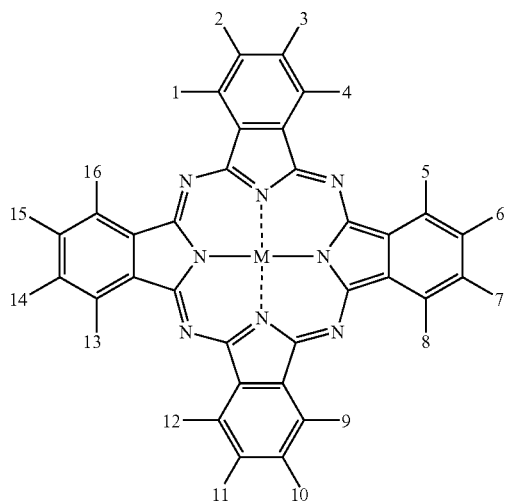
| Exemplary compound | M | Substituents at positions 1 or 4, 5 or 8, 9 or 12, and 13 or 16 (other four positions are occupied by H) | Substituents of the other eight positions |
|---|---|---|---|
| C-54 | | | |
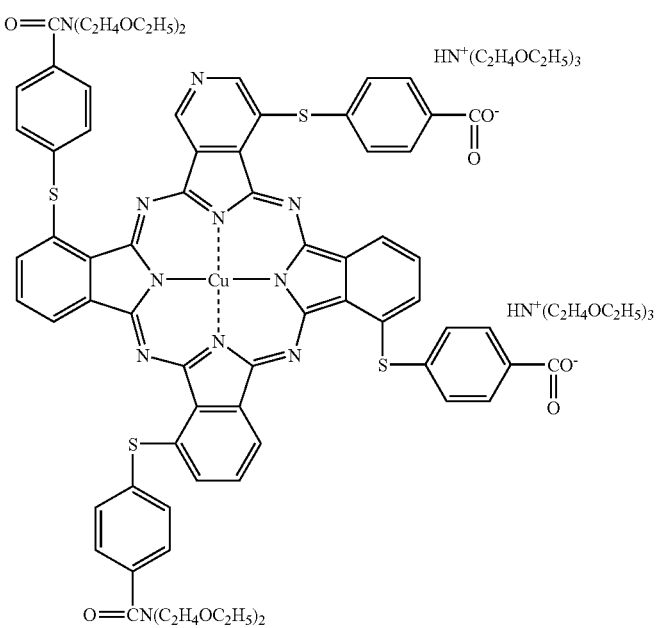

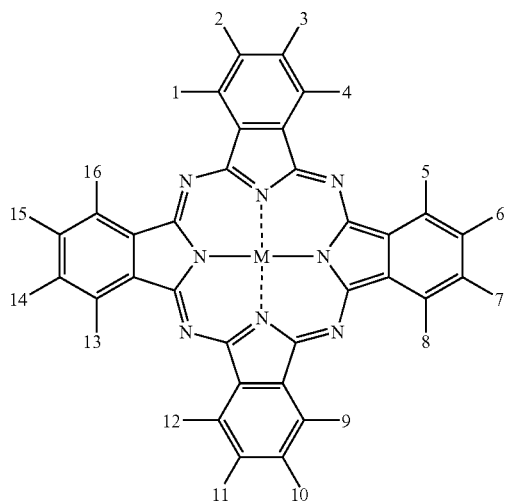
| Exemplary compound M | Substituents at positions 1 or 4, 5 or 8, 9 or 12, and 13 or 16 (other four positions are occupied by H) | Substituents of the other eight positions |
|---|---|---|
| C-55 | | |
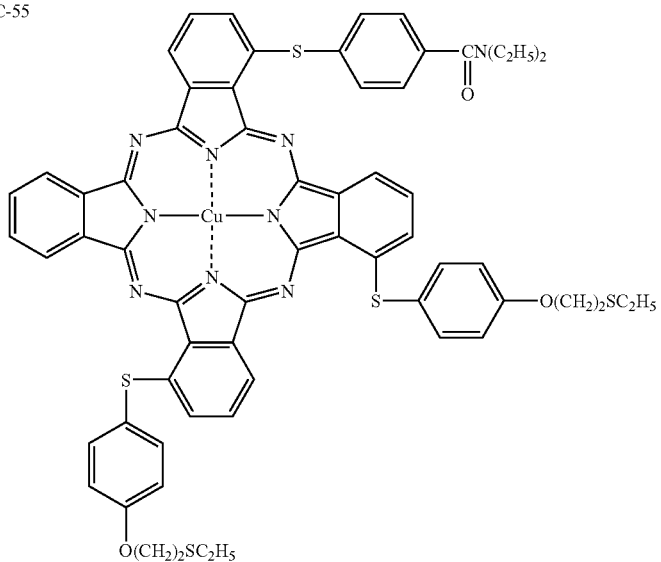

-continued
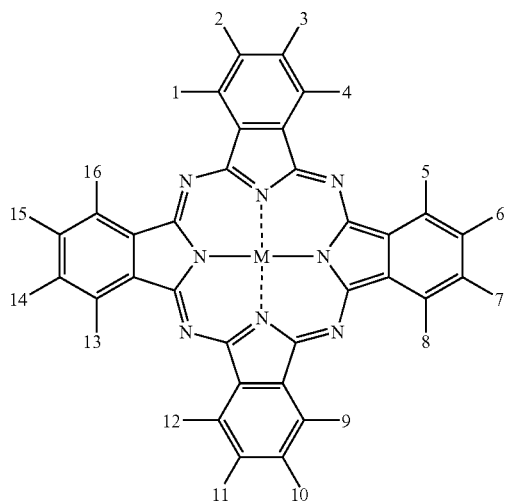
| Exemplary compound M | Substituents at positions 1 or 4, 5 or 8, 9 or 12, and 13 or 16 (other four positions are occupied by H) | Substituents of the other eight positions |
|---|---|---|
C-56
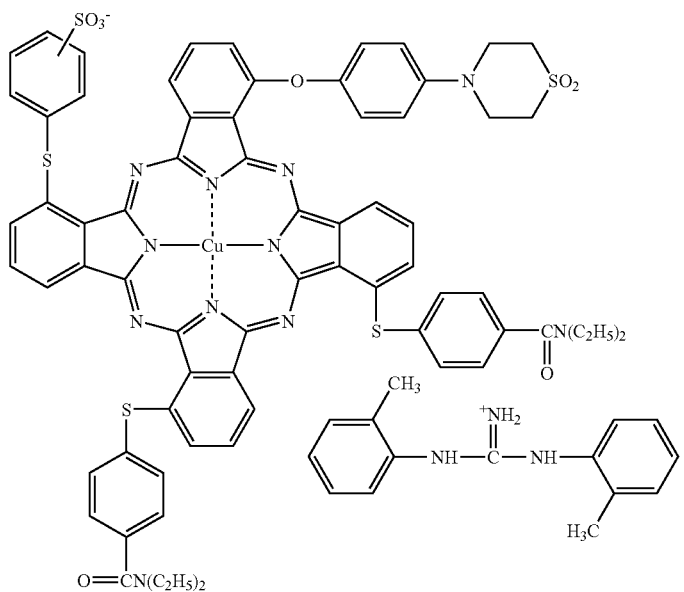

-continued
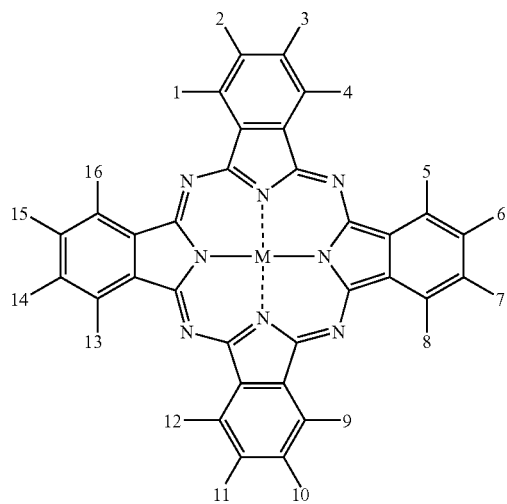
| Exemplary compound M | Substituents at positions 1 or 4, 5 or 8, 9 or 12, and 13 or 16 (other four positions are occupied by H) | Substituents of the other eight positions |
|---|---|---|
| C-57 | 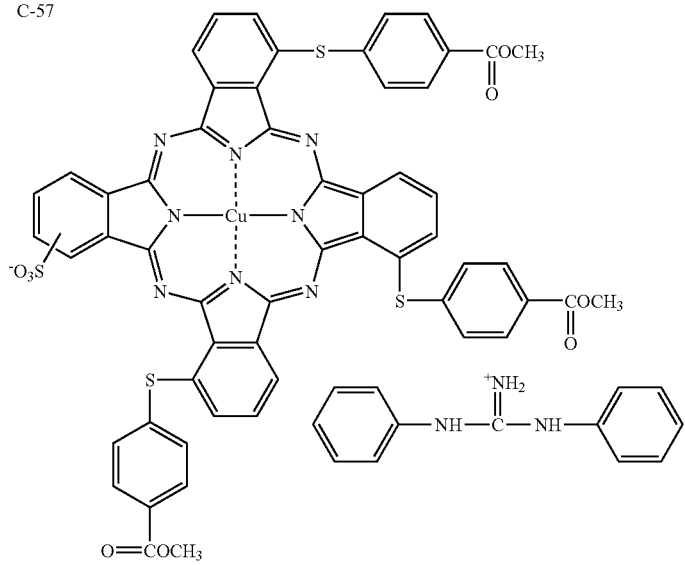 | |

-continued
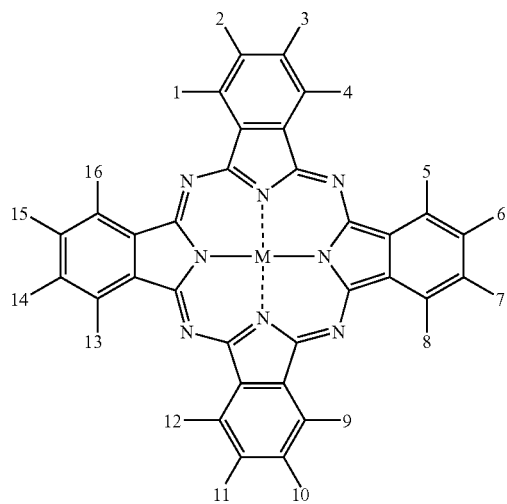
| Exemplary compound M | Substituents at positions 1 or 4, 5 or 8, 9 or 12, and 13 or 16 (other four positions are occupied by H) | Substituents of the other eight positions |
|---|---|---|
| C-58 | | |
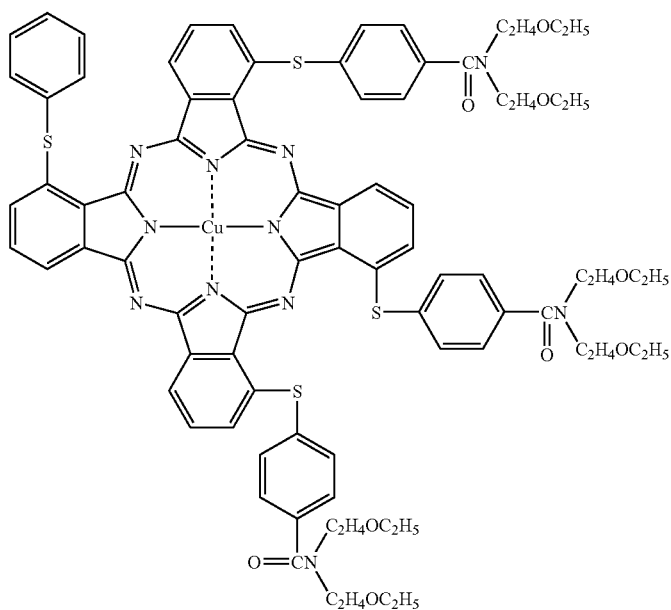

-continued

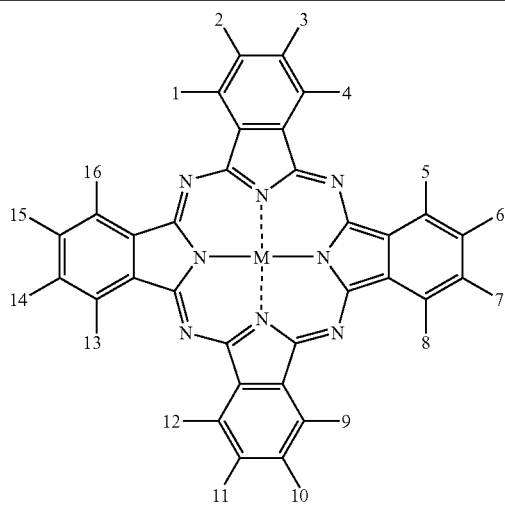

| Exemplary compound | M | Substituents at positions 1 or 4, 5 or 8, 9 or 12, and 13 or 16 (other four positions are occupied by H) | Substituents of the other eight positions |
|---|---|---|---|
| C-59 | | | |

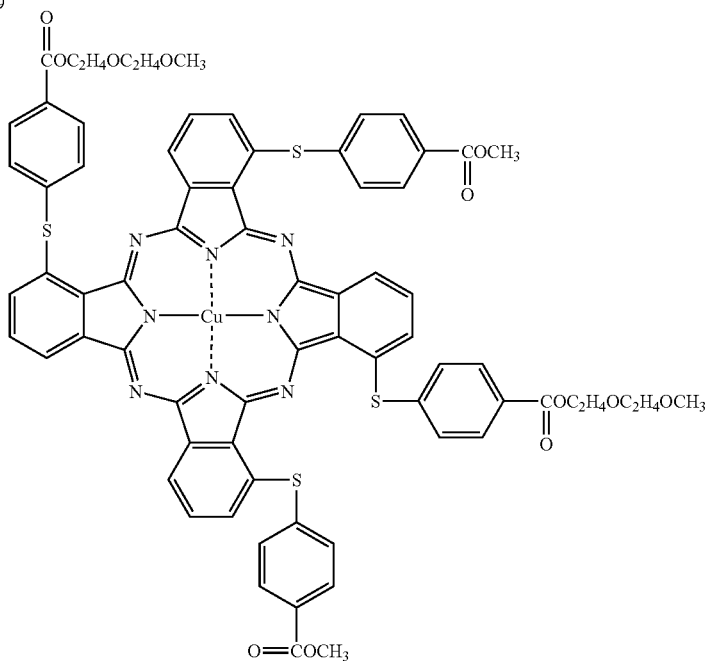

In the dye-containing negative working curable composition, the ratio of the organic solvent-soluble phthalocyanine dye to the total solid content is preferably 20% to 70% by mass, more preferably 22% to 68% by mass, and particularly preferably 25% to 65% by mass, from the viewpoint of the absorbance due to the dye and film curability.

Further, in the dye-containing negative working curable composition, the ratio of all the dye(s) to the total solid content is preferably 20% to 80% by mass, more preferably 30% to 75% by mass, and particularly preferably 40% to 70% by mass.

~Photopolymerization Initiator~

The dye-containing negative working curable composition of the invention contains at least one kind selected from photopolymerization initiators.

The photopolymerization initiator is not particularly restricted so long as it is able to polymerize the monomer having a polymerizable group, and preferably selected from the viewpoint of its properties, polymerization initiation efficiency, absorbing wavelength, availability and cost and the like.

The photopolymerization initiators include at least one active halogen compounds selected from halomethyloxadiazole compounds and halomethyl-s-triazine compounds, 3-aryl substituted coumarin compounds, lophine dimmers, benzophenone compounds, acetophenone compounds and derivatives thereof, cyclopentadiene-benzene-iron complexes and salts thereof, and oxime compounds.

The halomethyloxadiazole compounds of the active halogen compounds include 2-halomethyl-5-vinyl-1,3,4-oxadiazole compounds described in JP-B-57-6096, 2-trichloromethyl-5-styryl-1,3,4-oxadiazole, 2-trichloromethyl-5-(p-cyanostyryl)-1,3,4-oxadiazole, and 2-trichloromethyl-5-(p-methoxystyryl)-1,3,4-oxadiazole.

The halomethyl-s-triazine compounds of the active halogen compounds include vinyl-halomethyl-s-triazine compounds described in JP-B-59-1281, and 2-(naphtho-1-yl)-4,6-bis-halomethyl-s-triazine compounds and 4-(p-aminophenyl)-2,6-di-halomethyl-s-triazine compounds described in JP-A-53-133428.

Other specific examples include 2,4-bis(trichloromethyl)-6-p-methoxystyryl-s-triazine, 2,6-bis(trichloromethyl)-4-(3,4-methylenedioxyphenyl)-1,3,5-triazine, 2,6-bis(trichloromethyl)-4-(4-methoxyphenyl)-1,3,5-triazine, 2,4-bis(trichloromethyl)-6-(1-p-dimethylaminophenyl-1,3-butadienyl)-s-triazine, 2-trichloromethyl-4-amino-6-p-methoxystyryl-s-triazine, 2-(naphtho-1-yl)-4,6-bis-trichloromethyl-s-triazine, 2-(4-methoxy-naphtho-1-yl)-4,6-bis-trichloromethyl-s-triazine, 2-(4-ethoxy-naphtho-1-yl)-4,6-bis-trichloromethyl-s-triazine, 2-(4-butoxy-naphtho-1-yl)-4,6-bis-trichloromethyl-s-triazine, 2-[4-(2-methoxyethyl)-naphtho-1-yl]-4,6-bis-trichloromethyl-s-triazine, 2-[4-(2-ethoxyethyl)-naphtho-1-yl]-4,6-bis-trichloromethyl-s-triazine, 2-[4-(2-butoxyethyl)-napto-1-yl]-4,6-bis-trichloromethyl-s-triazine, 2-(2-methoxy-naphtho-1-yl)-4,6-bis-trichloromethyl-s-triazine, 2-(6-methoxy-5-methyl-naphtho-2-yl)-4,6-bis-trichloromehtyl-s-triazine, 2-(6-methoxy-naphtho-2-yl)-4,6-bis-trichloromethyl-s-triazine, 2-(5-methoxy-naphtho-1-yl)-4,6-bis-trichloromethyl-s-triazine, 2-(4,7-dimethoxy-naphtho-1-yl)-4,6-bis-trichloromethyl-s-triazine, 2-(6-ethoxy-naphtho-2-yl)-4,6-bis-trichloromethyl-s-triazine, 2-(4,5-dimethoxy-naphtho-1-yl)-4,6-bis-trichloromethyl-s-triazine, 4-[p-N,N-di(ethoxycarbonylmethyl)aminophenly]-2,6-di(trichloromethyl)-s-triazine, 4-[o-methyl-p-N,N-di(ethoxycarbonylmethyl)aminophenyl]2,6-di(trichloromethyl)-s-triazine, 4-[p-N,N-di(chloroethyl)aminophenyl]-2,6-di(trichloromethyl)-s-triazine, 4-[o-methyl-p-N,N-di(chloroethyl)aminophenyl]-2,6-di(trichloroethyl)-s-triazine, 4-(p-N-chloroethylaminophenly)-2,6-di(trichloromethyl)-s-triazine, 4-(p-N-ethoxycarbonylmethylaminophenol) -2,6-di(trichloromethyl)-s-triazine, 4-[p-N,N-di(phenyl)aminophenyl]-2,6-di(trichloromethyl)-s-triazine, 4-(p-N-chloroethylcarbonylaminophenyl) -2,6-di(trichloromethyl)-s-triazine, 4-[p-N-(p-mehtoxyphenyl)carmonylaminophenyl]-2,6-di(trichloromethyl)-s-triazine, 4-[m-N,N-di(ethoxycarbonylmethyl)aminophenyl]-2,6-di(trichloromethyl)-s-triazine, 4-[m-bromo-p-N,N-di(ethoxycarbonylmethyl)aminophenyl]-2,6-di(trichloromethyl)-s-triazine, 4-[m-chloro-p-N,N-di(ethoxycarbonylmethyl)aminophenyl]-2,6-di(trichloromethyl)-s-triazine, 4-[m-fluoro-p-N,N-di(ethoxycarbonylmethyl)aminophenyl]-2,6-di(trichloromethyl)-s-triazine, 4-[o-bromo-p-N,N-di(ethoxycarbonylmethyl)aminophenyl]-2,6-di(trichloromethyl)-s-triazine, 4-[o-chloro-p-N,N-di(ethoxycarbonylmethyl)aminophenyl]-2,6-di(trichloromethyl)-s-triazine, 4-[o-fluoro-p-N,N-di(ethoxycarbonylmethyl)aminophenyl]-2,6-di(trichloromethyl)-s-triazine, 4-[o-bromo-p-N,N-di(chloroethyl)aminophenyl]-2,6-di(trichloromethyl)-s-triazine, 4-[o-chloro-p-N,N-di(chloroethyl)aminophenyl]-2,6-di(trichloromethyl)-s-triazine, 4-[o-fluoro-p-N,N-di(chloroethyl)aminohenyl]-2,6-di(trichloromethyl)-s-triazine, 4-[m-bromo-p-N,N-di(chloroethyl)aminohenyl]-2,6-di(trichloromethyl)-s-triazine, 4-[m-chloro-p-N,N-di(chloroethyl)aminophenyl]-2,6-di(trichloromethyl)-s-triazine, 4-[m-fluoro-p-N,N-di(chloroethyl)aminophenyl]-2,6-di(trichloromethyl)-s-triazine, 4-(m-bromo-p-N-ethoxycarbonylmethylaminophenyl)-2,6-di(trichloromethyl)-s-triazine, 4-(m-chloro-p-N-ethoxycarbonylmethylaminophenyl)-2,6-di(trichloromethyl)-s-triazine, 4-(m-fluoro-p-N-ethoxycarbonylmethylaminophenyl)-2,6-di(trichloromethyl)-s-triazine, 4-(o-bromo-p-N-ethoxycarbonylmethylaminophenyl)-2,6-di(trichloromethyl)-s-triazine, 4-(o-chloro-p-N-ethoxycarbonylmethylaminophenyl)-2,6-di(trichloromethyl)-s-triazine, 4-(o-fluoro-p-N-ethoxycarbonylmethylaminophenyl)-2,6-di(trichloromethyl)-s-triazine, 4-(m-bromo-p-N-chloroethylaminophenyl)-2,6-di(trichloromethyl)-s-triazine, 4-(m-chloro-p-N-chloroethylaminophenyl)-2,6-di(trichloromethyl)-s-triazine, 4-(m-fluoro-p-N-chloroethylaminophenyl)-2,6-di(trichloromethyl)-s-triazine, 4-(o-bromo-p-N-chloroethylaminophenyl)-2,6-di(trichloromethyl)-s-triazine, 4-(o-chloro-p-N-chloroethylaminophenyl)-2,6-di(trichloromethyl)-s-triazine, and 4-(o-fluoro-p-N-chloroethylaminophenyl)-2,6-di(trichloromethyl)-s-triazine.

Other preferable examples include TAZ-series manufactured by Midori Kagaku Co., Ltd. (for example, trade name: TAZ-107, TAZ-110, TAZ-104, TAZ-109, TAZ-140, TAZ-204, TAZ-113 and TAZ-123), T series manufactured by PAN-CHIM, Ltd. (for example, trade name: T-OMS, T-BMP, T-R, and T-B), IRGACURE series (for example, trade name: IRGACURE 651, IRGACURE 184, IRGACURE 500, IRGACURE 1000, IRGACURE 149, IRGACURE 819, IRGACURE 261) and DAROCUR series (for example, trade name: DAROCUR 1173) manufactured by Ciba Specialty Chemicals, and 4,4'-bis(diethylamino)-benzophenone, 2-(O-benzoyloxime)-1-[4-(phenylthio)phenyl]-1,2-octandione, 2-benzyl-2-dimethylamino-4-morpholinobutyrophenone, 2,2-dimethoxy-2-phenylacetophenone, 2-(o-chlorophenyl)-4,5-diphenylimidazolyl dimer, 2-(o-fluorophenyl)-4,5-diphenylimidazolyl dimer, 2-(o-methoxyphenyl)-4,5-diphenylimidazolyl dimer, 2-(p-methoxyphenyl)-4,5-diphenylimidazolyl dimer, 2-(p-dimethoxyphenyl)-4,5-diphenylimidazolyl dimer, 2-(2,4-dimethoxyphenyl)-4,5-diphenylimidazolyl dimer, 2-(p-methylmercaptophenyl)-4,5-diphenylimidazolyl dimer, benzoin isopropyl ether and the like are suitably used.

Among the above initiators, preferred are oxime compounds, and the most preferred are 2-(O-benzoyloxime)-1-[4-(phenylthio)phenyl]-1,2-octanedione and 1-(O-acetyloxime)-1-[9-ethyl-6-(2-methylbenzoyl)-9H-carbazole-3-yl]ethanone.

Known Photopolymerization initiators other than those described above may be used together with the dye-containing curable composition of the invention. Examples of them include vicinal polyketolaldonyl compounds described in U.S. Pat. No. 2,367,660, α-carbonyl compounds described in U.S. Pat. Nos. 2,367,661 and 2,367,670, acyloin ether compounds described in U.S. Pat. No. 2,448,828, aromatic acyloin compounds substituted with α-carbohydrates described in U.S. Pat. No. 2,722,512, polynuclear quinone compounds described in U.S. Pat. Nos. 3,046,127 and 2,951,758, combinations of trially imidazole dimer and p-aminophenyl ketone described in U.S. Pat. No. 3,549,367, and bemzothiazole compounds/trihalomethyl-s-triazine compounds described in JP-B No. 51-48516.

Sensitizers and light stabilizers may be used together with these photopolymerization initiators. Specific examples of them include benzoin, benzoin methylether, 9-fluorenone, 2-chloro-9-fluorenone, 2-methyl-9-fluorenone, 9-anthrone, 2-bromo-9-anthrone, 2-ethyl-9-anthrone, 9,10-anthraqunone, 2-ethyl-9,10-anthraquinone, 2-t-butyl-9,10-anthraquinone, 2,6-dichloro-9,10-anthraquinone, xanthone, 2-methylxanthone, 2-methoxyxanthone, 2-ethoxyxanthone, thioxanthone, 2,4-diethylthioxanthone, acrydone, 10-butyl-2-chloroacrydone, benzyl, banzalacetone, p-(dimethylamino)phenylstyrylketone, p-(dimethylamino)phanyl-p-methylstyrrylketone, dibenzophenone, p-(dimethylamino) benzophenone (or Michler's ketone), p-(diethylamino) benzophenone, benzoanthrone, and benzothiazole compounds described in JP-B No. 51-48516, Tinuvin 1130 and Tinuvin 400.

In the dye-containing negative working curable composition, the ratio of the photopolymerization initiator to the total solid content is preferably 1.0% to 40.0% by mass, more preferably 2.5% to 30.0% by mass, and particularly preferably 5.0% to 20.0% by mass. When the ratio of the photopolymerization initiator is within the above range, the polymerization proceeds sufficiently and the polymerization rate is increased, while the film strength is not lowered by reduction of the molecular weight.

A heat polymerization inhibitor is preferably added on addition to the additives above, and preferable examples thereof include hydroquinone, p-methoxyphenol, di-t-butyl-p-cresol, pyrogallol, t-butylcatechol, benzoquinone, 4,4'-thiobis(3-methyl-6-t-butylphenol), 2,2'-methylenebis(4-methyl-6-t-butylphenol) and 2-mercaptobenzimidazole.

~Polymerizable Monomer~

The dye-containing negative working curable composition of the invention contains at least one kind selected from polymerizable monomers.

The polymerizable monomer is preferably a compound comprising at least one ethylenic unsaturated group capable of addition polymerization and a boiling point of 100° C. or more at normal pressures.

Examples of the monomer-containing compounds include monofunctional acrylate and methacrylate such as polyethyleneglycol mono(meth)acrylate, polypropyleneglycol mono (meth)acrylate, phenoxyethyl(meth)acrylate; (meth)acrylate compounds prepared after an addition reaction of ethylene oxide or propylene oxide to polyfunctional alcohols such as polyethyleneglycol di(meth)acrylate, trimethylolethane tri (meth)acrylate, neopentylglycol di(meth)acrylate, pentaerythritol tri(meth)acrylate, pentaerythritol tetra(meth)acrylate, dipentaerythritol penta(meth)acrylate, dipentaerythritol hexa(meth)acrylate, hexanediol (meth) acrylate, trimethylolpropane tri(acryloyloxypropyl)ether, tri (acryloyloxyethyl) isocyanulate, glycerine and trimethylolethane; urethane acrylates described in JP-B Nos. 48-41708 and 50-6034, and JP-A No. 51-37193; polyester acrylates described in JP-A No. 48-64183 and JP-B No. 49-43191 and 52-30490; polyfunctional acrylate and methacrylate of epoxyacrylate as a reaction product of an epoxy resin and (meth)acrylic acid; and mixtures thereof. The compounds described in Nihon Secchaku Kyokai-shi Vol. 20, No. 7, pp. 300-308 as a photo-curable monomer and an oligomer are also included in the compounds of the invention.

In addition to the above, radical polymerizable monomers containing a carboxyl group such as the following formulas (III-1) and (III-2) can be preferably used. In the formulas (III-1) and (III-2), when T or G is an oxyalkylene group, the carbon atom end is bound to R, X and W.

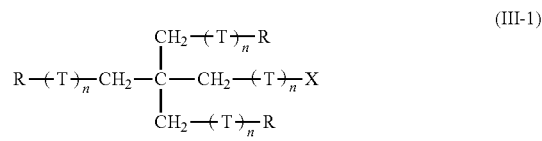

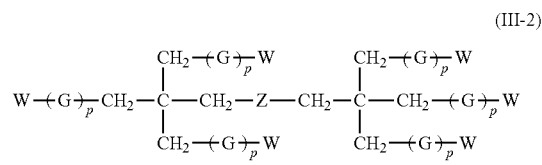

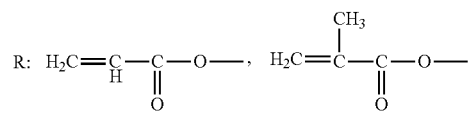

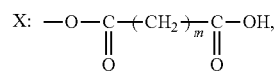

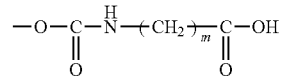

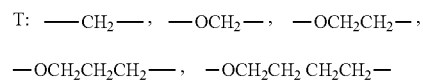

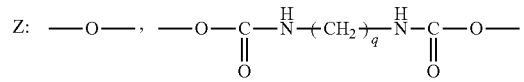

In the formula (III-1), n is 0 to 14 and m is 1 to 8. In the formula (III-2), W has the same definition as R or X of the formula (III-1), and among the six W's, three or more W is R. p is 0 to 14 and q is 1 to 8. A plurality of R, X, T and G existing in a molecule are individually identical with or different from each other.

Among radical polymerizable monomers represented by the formulas (III-1) or (III-2), as specific examples, those represented by the following formulas (M-1) to (M-12) are preferred. Among these, the formula (M-2), the formula (M-3) and the formula (M-5) are preferred as radical polymerizable monomers.

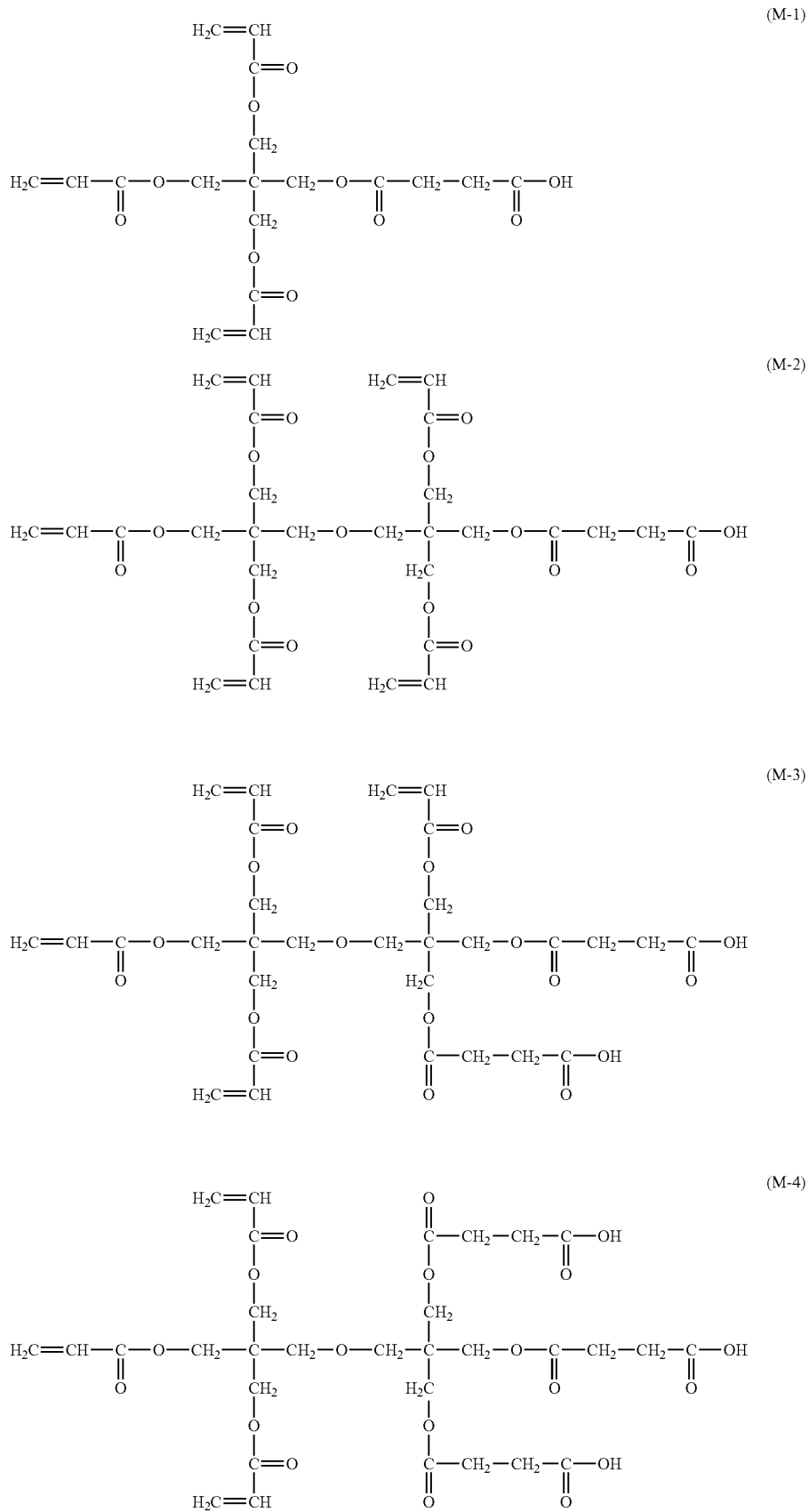

-continued
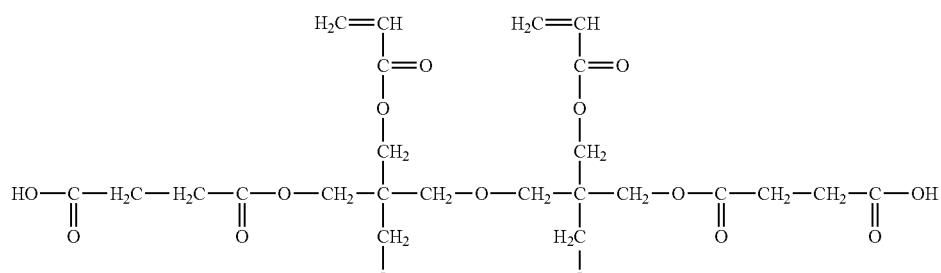
(M-5)
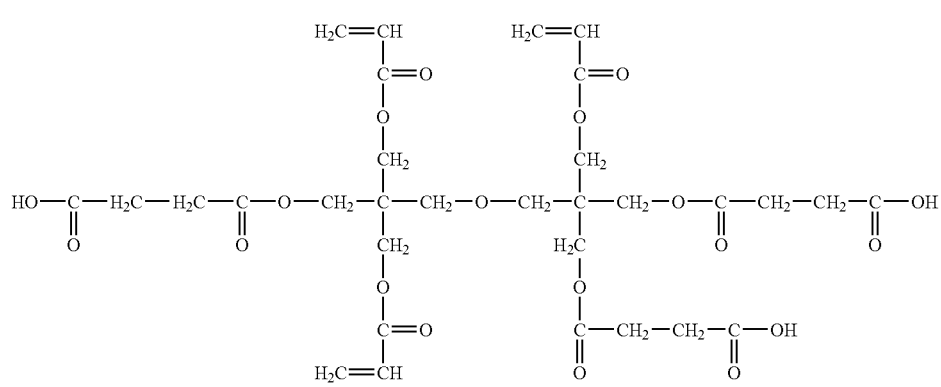
(M-6)
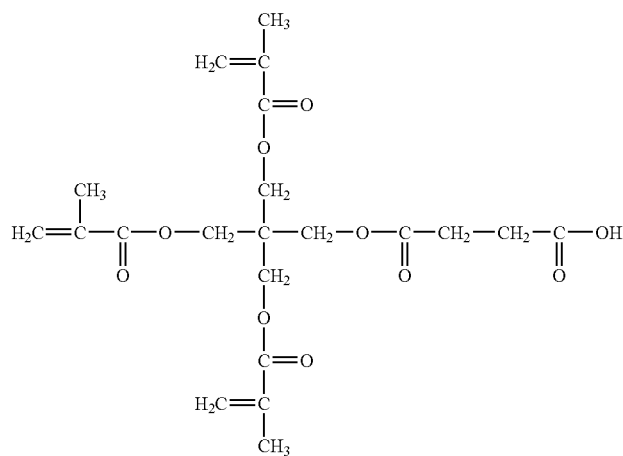
(M-7)
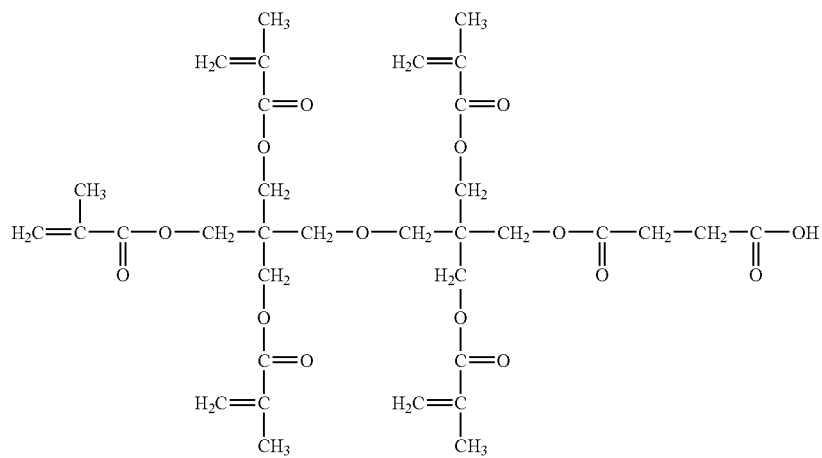
(M-8)

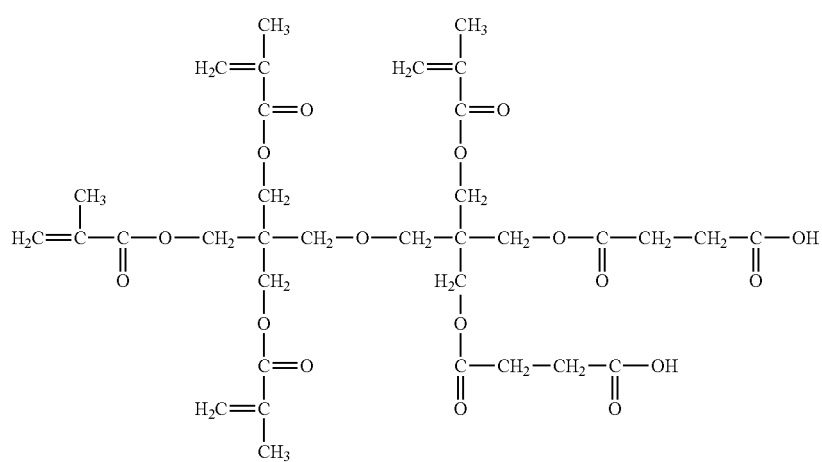
(M-9)
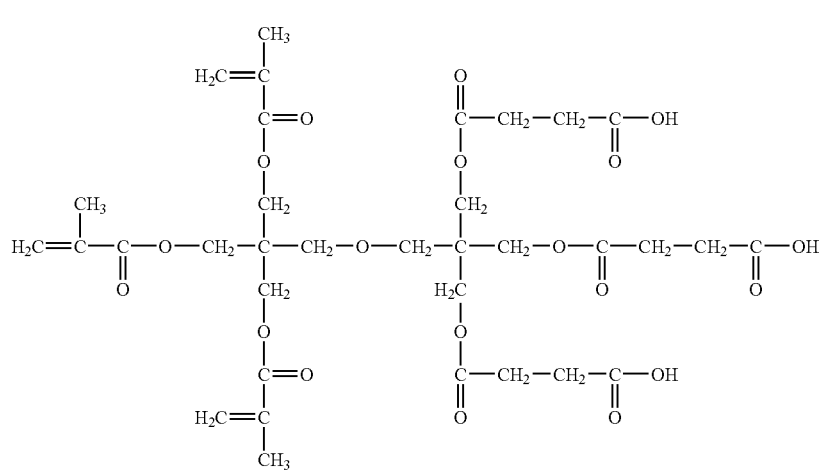
(M-10)
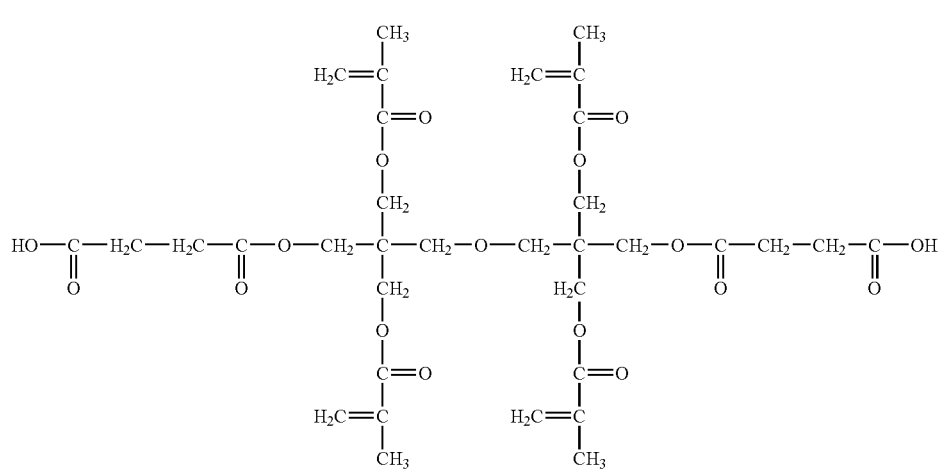
(M-11)

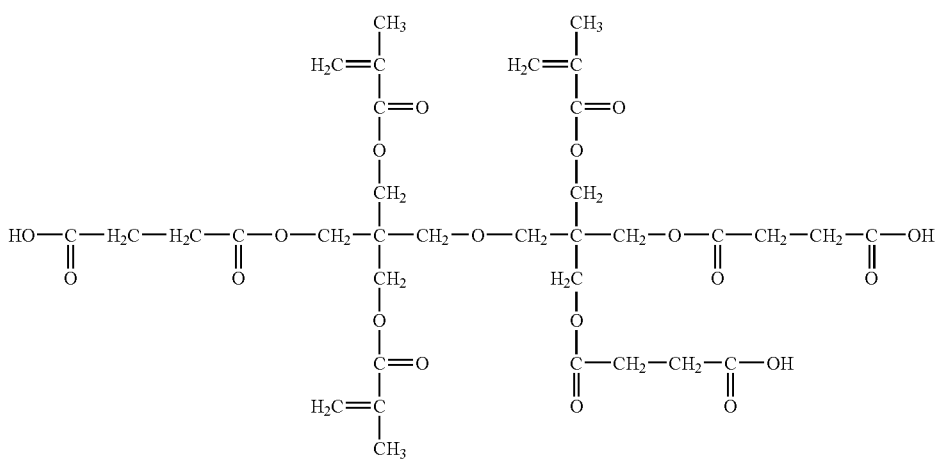

(M-12)

In the dye-containing negative working curable composition, the ratio of the polymerizable monomer to the total solid content is preferably 20% to 70% by mass, more preferably 22% to 65% by mass, and further preferably 25% to 60% by mass. When the ratio is within the above range, there is no case where the cure degree of the exposed portion is insufficient and the elution of the unexposed portion is remarkably reduced.

~Colorless Compound Having Number Average Molecular Weight of 1,000 to 5,000~

The dye-containing negative working curable composition of the invention contains at least one colorless compound having a number average molecular weight of 1,000 to 5,000 (which may be hereinafter referred to as "the colorless compound of the invention"). As a result of using the colorless compound in combination with the dye, the composition exhibits a sufficient stability over time with suppressed generation of contamination, has excellent contact with objects to be coated or substrates, and has improved sensitivity. Further, the compound is effective for forming an excellent pattern without development residue.

The term "colorless" means that the compound has 0 to 5,000 of the maximum value of molar absorption coefficient ε in the visible region. The molar absorption coefficient ε is measured by using a cyclohexanone solution by UV-2500PC (manufactured by Shimadzu Corporation).

The colorless compound having a number average molecular weight of 1,000 to 5,000 (the colorless compound of the invention) is not particularly limited as long as it is colorless and has a number average molecular weight of 1,000 to 5,000. The colorless compound of the invention may be appropriately selected depending on the heat resistance, development property, availability, and the like.

The number average molecular weight is an average molecular weight divided by the number of molecules, and can be measured by end-group determination method, membrane osmometry, and the like. Specifically, the number average molecular weight is measured by GPC SC-8020 (manufactured by Shimadzu Corporation).

It is particularly preferred that the colorless compound of the invention has no photocrosslinkable groups and no cyclic ether groups from the viewpoint of the stability over time.

Further, it is preferred that the colorless compound of the invention has two or more hydroxyl groups from the viewpoint of suppressing the contamination generation over time.

Further, it is more preferred that the colorless compound of the invention is alkali-insoluble from the viewpoint of attaining higher sensitivity. The term "alkali-insoluble" means that the compound cannot be completely dissolved in an alkali solution as a 10% solution. The alkali solution may be an aqueous alkali solution prepared by dissolving an alkali agent in water and the like.

In view of the sensitivity, the number average molecular weight of the colorless compound of the invention is more preferably 1,200 to 4,000, and most preferably 1,400 to 3,000.

Specific examples of the "colorless compound having a number average molecular weight of 1,000 to 5,000" include polyoxyethylene bis(amine), poly(propylene glycol)bis(2-aminopropyl ether), polystyrene, polymethyl methacrylate, and compounds having partial structures represented by the following formula (IV).

In the dye-containing negative working curable composition, the ratio of the colorless compound of the invention to the total solid content is preferably 0.01% to 5.0% by mass, more preferably 0.02% to 4.0% by mass, and particularly preferably 0.05% to 3.0% by mass.

Among the colorless compounds having a number average molecular weight of 1,000 to 5,000, a compound having a partial structure represented by the following formula (IV) is most preferably.

—O-L-$(C_aH_bO)_n$—H    formula (IV)

In the formula (IV), L represents a linking group. The linking group includes a divalent group. The linking group is preferably a single bond, an aliphatic group, an aromatic group, or a carbonyl group, and more preferably a single bond or an aliphatic group. The linking group may have a substituent.

The aliphatic group is preferably an alkylene group having 1 to 5 carbon atoms, and examples thereof include a methylene group, an ethylene group, a propylene group, and an isopropylene group. The aromatic group is preferably a phenylene group or a derivative thereof, and examples thereof include a phenylene group, a methylphenylene group, and a dimethylphenylene group.

Further, a represents an integer of 2 or 3, b represents an integer of 2a, and n represents an integer.

The partial structure represented by the formula (IV) has preferably a propoxylate structure with a=3 and b=6, more preferably a propoxylate structure with a=3, b=6, and n=5 or more.

It is most preferred that the colorless compound has two or more partial structures represented by the formula (IV).

Among commercially available "colorless compounds having a number average molecular weight of 1,000 to 5,000", specific examples of compounds having the partial structure represented by the formula (IV) will be described below, without intention of restricting the scope of the invention.

The specific examples include poly(propylene glycol), poly(ethylene glycol-propylene glycol), poly(ethylene glycol), poly(ethylene glycol or propylene glycol)monobutyl ether, glycerol ethoxylate, glycerol propoxylate, glycerol propoxylate-B-ethoxylate triol, glycerol ethoxylate-co-propoxylate triol, poly(ethylene glycol)methyl ether, poly(ethylene glycol)butyl ether, trimethylolpropane ethoxylate, trimethylolpropane propoxylate, neopentyl glycol ethoxylate, neopentyl glycol propoxylate, pentaerythritol ethoxylate, pentaerythritol propoxylate, poly(ethylene glycol)tetrahydrofuryl ether, triethanolamine ethoxylate, bisphenol A ethoxylate, bisphenol A propoxylate, bisphenol A propoxylate/ethoxylate, polyoxyethylene bis(amine), and poly(propylene glycol)bis(2-aminopropyl ether).

~Alkali-soluble Binder~

The dye-containing curable composition of the invention may comprise an alkali-soluble binder. This alkali-soluble binder is not particularly restricted so long as it is soluble in an alkali. The alkali-soluble binder is preferably selected from the viewpoint of a heat resistance, a development ability and an availability and the like.

The alkali-soluble binder is preferably a linear organic polymer, soluble in organic solvents, and is able to be developed with a weak aqueous alkali solution. Such linear organic polymers include polymers having carboxylic acids at the side chains. Examples of the polymer having carboxylic acids at the side chains include methacrylic acid copolymers, acrylic acid copolymers, itaconic acid copolymers, crotonic acid copolymers, maleic acid copolymers and partially esterified maleic acid copolymers as described in JP-A Nos. 59-44615, 59-53836 and 59-71048, and Japanese Patent Application Publication (JP-B) Nos. 54-34327, 58-12577 and 54-25957.

Otherwise, acidic cellulose derivatives having carboxylic acids at the side chains are preferable as the alkali-soluble binder.

Other preferable alkali-soluble binders include adducts of acid anhydrides to polymers having hydroxyl groups, polyhydroxystyrene resins, polysiloxane resins, poly(2-hydroxyethyl(meth)acrylate), polyvinyl pyrrolidone, polyethylene oxide and polyvinyl alcohol.

A Hydrophilic monomer may be copolymerized with the alkali-soluble binder. Examples of such monomer include alkoxyalkyl(meth)acrylate, hydroxyalkyl(meth)acrylate, glycerol (meth)acrylate, (meth)acrylamide, N-methylol acrylamide, secondary or tertiary alkyl acrylamide, dialkylaminoalkyl(meth)acrylate, morpholine (meth)acrylate, N-vinyl pyrrolidone, N-vinyl caprolactam, vinyl imidazole, vinyl triazole, methyl(meth)acrylate, ethyl(meth)acrylate, branched or linear propyl(meth)acrylate, branched or linear butyl(meth)acrylate, and phenoxyhydroxypropyl(meth)acrylate.

Other preferable hydrophilic monomers include those containing tetrahydrofurfulyl group, phosphate, phosphate ester, quaternary ammonium salt, ethyleneoxy chain, propyleneoxy chain, sulfonic acid group and salts thereof, and morpholinoethyl groups.

The alkali-soluble binder may have polymerizable groups at the side chain for improving the cross-linking efficiency when the dye-containing composition of the invention is structured as a negative working composition. Polymers having allyl group, (meth)acrylic or allyloxyalkyl groups at the side chains are also preferable. Examples of the polymer having such polymerizable group will be described below. The polymers having the polymerizable group are not restricted to those shown below, so long as they contain alkali soluble groups such as COOH, OH and ammonium groups, and carbon-carbon unsaturated bonds.

Specific examples of the polymer having the polymerizable group include a compound obtained by reacting a compound having an epoxy ring reactive to the OH group and carbon-carbon unsaturated double bonds (for example, glycidyl acrylate) with a copolymer of a compound having OH groups (for example 2-hydroxyethyl acrylate), a compound having COOH groups (for example methacrylic acid), and a monomer of an acrylic-based or a vinyl-based compound copolymerizable with these compounds. The compounds having a group reactive to the OH group available include an epoxy ring as well as compounds having an acid anhydride, an isocyanate group or an acryloyl group. A reaction product obtained by reacting a saturated or unsaturated polybasic acid anhydrate with a compound obtained by allowing an unsaturated carboxylic acid such as acrylic acid to react with a compound having an epoxy ring as disclosed in JP-A Nos. 6-102669 and 6-1938 may be also used. Examples of the compound having the alkali soluble group such as COOH group and carbon-carbon unsaturated bond together include Dianal NR series (trade name; manufactured by Mitsubishi Rayon Co., Ltd.), Photomer 6173 (trade name; polyurethane acrylic oligomer containing COOH group; manufactured by Diamond Shamrock Co., Ltd.), Biscoat R-264 and KS Resist 106 (trade names; manufactured by Osaka Organic Chemical Industry Ltd.), Cyclomer P series and Plakcel CF200 series (trade names; manufactured by Daicel Chemical Industries, Ltd.), and Ebecryl 3800 (trade name; manufactured by Daicel UBC Co., Ltd.).

Among the above alkali-soluble binder, the acrylic resins are preferable. Preferable examples of the acrylic resin include copolymers comprising the monomers selected from benzyl(meth)acrylate, (meth)acrylic acid, hydroxyethyl (meth)acrylate and (meth)acrylamide, KS Resist 106 (manufactured by Osaka Organic Chemical Industry Ltd.), and Cyclomer P series (manufactured by Daicel Chemical Industry Co.).

The alkali-soluble binder is preferably polymers having a weight average molecular weight of 1000 to $2 \times 10^5$, more preferably polymer having the weight average molecular weight of 2000 to $1 \times 10^5$, and particularly polymer having the weight average molecular weight of 5000 to $5 \times 10^4$ measured by GPC and converted into polystyrene.

In the dye-containing negative working curable composition, the ratio of the alkali-soluble resin to the total solid content is 10.0% by mass or less, preferably 8.0% by mass or less, and more preferably 6.0% by mass or less. It is most preferred that the alkali-soluble resin is not used in the composition from the viewpoint of attaining higher sensitivity.

~Solvent~

In general, the dye-containing negative working curable composition of the invention may contain a solvent.

The solvent is not particularly limited as long as sufficient solubility and coating property of the composition are obtained. The solvent is preferably selected in view of the solubility, coating property, and safeness of the dye and the colorless compound of the invention.

Examples of the preferable solvent include esters such as ethyl acetate, n-butyl acetate, isobutyl acetate, amyl formate, isoamyl acetate, butyl propionate, isopropyl butylate, ethyl butylate, butyl butylate, alkyl esters, methyl lactate, ethyl lactate, methyl oxylactate, ethyl oxylactate, butyl oxylactate, methyl methoxyacetate, ethyl methoxyacetate, butyl methoxyacetate, methyl ethoxyacetate, ethyl ethoxyacetate;

3-oxypropionic acid alkyl esters such as methyl 3-oxypropionate and ethyl 3-oxypropionate including methyl 3-methoxypropionate, ethyl 3-methoxypropionate, methyl 3-ethoxypropionate and ethyl 3-ethoxypropionate; 2-oxypropionic acid alkyl esters such as methyl 2-oxypropionate, ethyl 2-oxypropionate and propyl 2-oxypropionate including methyl 2-methoxypropyonate, ethyl 2-methoxypropionate, propyl 2-methoxypropionate, methyl 2-ethoxypropionate, ethyl 2-ethoxypropionate, methyl 2-oxy-2-methylpropionate, ethyl 2-oxy-2-methylpropionate, methyl 2-methoxy-2-methylpropionate, and ethyl 2-ethoxy-2-methylpropionate;

methyl pyruvate, ethyl pyruvate, propyl pyruvate, methyl acetoacetate, ethyl acetoacetate, methyl 2-oxobutanate and ethyl 2-oxobutanate;

ethers such as diethyleneglycol dimethylether, tetrahydrofuran, ethyleneglycol monomethylether, ethyleneglycol monoethylether, methyl cellosolve acetate, ethyl cellosolve acetate, diethyleneglycol monomethylether, diethyleneglycol monoethylether, diethyleneglycol monobutylether, propyleneglycol methyl ether, propyleneglycol methylether acetate, propyleneglycol ethylether acetate, and propyleneglycol propylether acetate;

ketones such as methylethyl ketone, cyclohexanone, 2-heptanone and 3-heptanone; and aromatic hydrocarbons such as toluene and xylene and the like.

Methyl 3-ethoxypropionate, ethyl 3-ethoxypropionate, ethyl cellosolve acetate, ethyl lactate, diethyleneglycol dimethylether, butyl acetate, methyl 3-methoxypropionate, 2-heptanone, cyclohexanone, cyclopentanone, ethylcarbitol acetate, butylcarbitol acetate, propyleneglycol methylether and propyleneglycol methylether acetate are more preferable among them.

Various additives such as fillers, polymer compounds other than those above, surfactants, adherence enhancing agents, antioxidants, ultraviolet absorbing agents and antiflocculants may be added, if necessary, to the dye-containing curable composition of the invention.

Specific examples of the additives include fillers such as glass and alumina; polymer compounds other than the binding resins such as polyvinyl alcohol, polyacrylic acid, polyethyleneglycol monoalkylether and polyfluoroalkyl acrylate; surfactants such as nonionic, cationic and anionic surfactants; adherence enhancing agents such as vinyl trimethoxy silane, vinyl triethoxy silane, vinyl tris(2-methoxyethoxy)silane, N-(2-aminoethyl)-3-aminopropylmethylmetoxy silane, N-(2-aminoethyl)-3-aminopropyltrimethoxy silane, 3-aminopropyltriethoxy silane, 3-glycidoxypropyl trimethoxy silane, 3-glycidoxypropyl methyldimethoxy silane, 2-(3,4-epoxycyclohexyl)ethyl trimethoxy silane, 3-chloropropylmethyl dimethoxy silane, 3-chloropropyl trimethoxy silane, 3-methacryloxypropyl trimethoxy silane, and 3-mercaptopropyl trimethoxy silane; antioxidants such as 2,2-thiobis(4-methyl-6-t-butylphenol) and 2,6-di-t-butylphenol; ultraviolet absorbing agents such as 2-(3-t-butyl-5-methyl-2-hydroxydiphenyl)-5-chlorobenzotriazole and alkoxybenzophenone; and antiflocculants such as sodium polyacrylate.

Organic carboxylic acids, preferably low molecular weight organic carboxylic acids with a molecular weight of 1000 or less may be added for enhancing alkali solubility of non-cured parts to further improving development ability of the dye-containing curable composition of the invention.

Examples of the organic carboxylic acid include aliphatic monocarboxylic acids such as formic acid, acetic acid, propionic acid, butyric acid, valeric acid, pivalic acid, caproic acid, diethylacetic acid, enanthic acid and caprylic acid; aliphatic dicarboxylic acids such as oxalic acid, malonic acid, succinic acid, glutaric acid, adipic acid, pimelic acid, suberic acid, azelaic acid, sebacic acid, brassylic acid, methylmalonic acid, ethylmalonic acid, dimetylmalonic acid, methylsuccinic acid, tetramethylsuccinic acid and citraconic acid; aliphatic tricarboxylic acid such as tricarballylic acid, aconitic acid and camphoronic acid; aromatic monocarboxylic acid such as benzoic acid, toluic acid, cuminic acid, hemelitic acid and mesitylenic acid; aromatic polycarboxylic acid such as phthalic acid, isophthalic acid, terephthalic acid, trimellitic acid, trimesic acid, mellophanic acid and pyromellitic acid; and other carboxylic acid such as phenylacetic acid, hydroatropic acid, hydrocinnamic acid, mandelic acid, phenylsuccinic acid, atropic acid, cinnamic acid, methyl cinnamate, benzyl cinnamate, cinnamilydenic acid, cumalic acid and umbelic acid.

The dye-containing curable composition of the invention may be suitably used for color filters used for liquid crystal displays (LCD) and solid state image pick-up elements (for example CCD and CMOS), for forming colored pixels such as electroluminescence color filters, and for preparing printing inks, ink-jet inks and paints.

<<Color Filter and Production Method Thereof>>

Next, the color filter of the invention will be described in detail below with reference to a method for producing the same.

The color filter of the invention is produced by using the composition of the invention. The color filter of the invention can be most preferably produced by a method of the invention using the composition of the invention. Specifically, the color filter can be produced such that the composition of the invention is applied to a support by coating method such as a spin coating method, casting method, roll coating method and the like, to form a photosensitive composition layer, and the composition layer is exposed through a predetermined mask pattern and then developed by a liquid developer to form a colored pattern. The method of the invention for producing the color filter may further include a curing process if necessary, in which the pattern formed by the above exposure and development is further heated and/or exposed to be hardened.

Particularly preferable radiation used for the exposure is an ultraviolet ray such as g-ray, h-ray and i-ray and the like.

Examples of the support include a soda glass, Pyrex (R) glass and quartz glass, which are used for a liquid crystal displays those on which a transparent conductive film is adhered, and the substrate of photoelectric conversion elements used for the imaging element such as, for example, a silicone substrate and complementary metal oxide film semiconductor (CMOS). Black stripes for isolating each pixel may be formed on these supports.

An undercoat layer may be provided on the support for improving adhesive property to the upper layers, for preventing diffusion of substances, and for planarizing the surface of the support.

Any developers may be used so long as they comprise a composition that is able to dissolve non-cured parts of the dye-containing curable composition of the invention while the cured parts are left undissolved. Specifically, a combination of various organic solvents and an aqueous alkali solution may be used.

As the organic solvent, the solvents used for preparing the dye-containing curable composition of the invention may be also used for the developer.

As the aqueous alkali solution, an aqueous alkali solution which dissolved an alkali compound in the concentration of 0.001 to 10% by mass (preferably 0.01 to 1% by mass) is preferred. Examples of the alkali compound include sodium hydroxide, potassium hydroxide, sodium carbonate, sodium silicate, sodium methanesilicate, ammonia water, ethylamine, diethylamine, dimethylethanolamine, tetramethylammonium hydroxide, tetraethylammonium hydroxide, choline, pyrrole, piperidine, and 1,8-diazabicyclo-[5.4.0]-7-undecene. When a developing solution prepared from such an aqueous alkali solution was used, generally after the development, the developing solution is washed with water.

The color filter of the invention can be used for the liquid crystal display (LCD) and solid state image pick-up element (for example CCD and CMOS). The color filter is suitable for a high resolution CCD element and CMOS having 1,000,000 pixels or more. The color filter of the invention may be used by disposing between the light-receiving part of the pixels constituting the CCD and micro-lenses for converging the light.

EXAMPLES

Hereinafter, the invention will be explained specifically with reference to examples. However, the invention is not limited to these Examples as long as the scope of the invention is not impaired. Unless noted differently, the "part" is based on the mass.

Examples 1

1) Preparation of Resist Solution

The components of the following composition were mixed and dissolved to prepare a resist solution.
<Composition>
 Propylene glycol monomethyl ether acetate (PGMEA): 19.20 parts
 Ethyl lactate: 36.67 parts
 Resin: 30.51 parts
(40% PGMEA solution of benzyl methacrylate/methacrylic acid/2-hydroxyethyl methacrylate copolymer (mole ratio 60/22/18))
 Dipentaerythritol hexaacrylate: 12.20 parts
(photopolymerizable compound)
 Polymerization inhibitor (p-methoxyphenol): 0.0061 parts
 Fluorine-based surfactant: 0.83 parts
(F-475, manufactured by DAINIPPON INK AND CHEMICALS, INC.)
 Photopolymerization initiator: 0.586 parts
(TAZ-107, manufactured by Midori kagaku Co., Ltd. (trihalomethyltriazine-based photopolymerization initiator))

2) Preparation of Glass Substrate Having Undercoat Layer

A 6-inch silicon wafer was heated at 200° C. for 30 minutes in an oven. Then, the above resist solution was applied onto the silicon wafer such that the dry thickness was 2 μm, and was dried under heating at 220° C. for 1 hour in an oven, to form an undercoat layer. Thus, a silicon wafer substrate having the undercoat layer was obtained.

3) Preparation of Colored Photosensitive Resin Composition

The compounds of the following composition were mixed and dissolved, to prepare a colored photosensitive resin composition A-1.

<Composition A-1>
 Cyclohexanone: 80 parts
 Coloring agent A: 6.0 parts
(Specific example 28 of the dye represented by the formula (I))
 Coloring agent B (Following compound b): 4.0 parts
 Radical polymerizable monomer: 7.0 parts
(3:7 mixture of Example Compound (M-2) and dipentaerythritol hexaacrylate)
 Photopolymerization initiator: 2.5 parts
(oxime-based photopolymerization initiator CGI-124, manufactured by Ciba Specialty Chemicals)
 Glycerol propoxylate: 0.5 parts
(colorless compound of the invention having number average molecular weight (Mn) of 1,500 and molar absorption coefficient $\epsilon$ of 0)

4) Evaluation of Stability Over Time

The number of in liquid particles (contaminations) in the above prepared colored photosensitive resin composition A-1 was measured by an in liquid particle counter (manufactured by Rion Co., Ltd.) immediately after the preparation of the composition and after 1 week storage at the room temperature, respectively. A composition showing no or small contamination increase over time is considered to be preferable. The measurement results are shown in Table 2.

5) Exposure, Development, and Evaluation of Colored Photosensitive Resin Composition -Pattern Formation and Sensitivity Evaluation- The colored photosensitive resin composition A-1 prepared in 3) was applied onto the undercoat layer of the silicon wafer substrate prepared in 2), to form a photocurable coating film. The coating film was heated (prebaked) at 100° C. for 120 seconds using a hot plate, such that the dry thickness was 0.9 μm. Then, the coating film was exposed to a 365 nm-wavelength light through a mask with a 2 μm square island pattern at an exposure amount of 1,000 mJ/cm$^2$ by an i-ray stepper exposure apparatus FPA-3000i5+(manufactured by Canon Inc.) The silicon wafer substrate with the exposed coating film was placed on a horizontal turntable of a spin shower developer DW-30 (manufactured by Chemitronics Co., Ltd.), and was paddle-developed at 23° C. for 60 seconds by using CD-2000 (manufactured by FUJIFILM Electronic Materials Co., Ltd.), to form a colored pattern on the silicon wafer substrate.

The silicon wafer substrate having the colored pattern formed thereon was set to the horizontal turntable by vacuum chuck. While the silicon wafer substrate was rotated at 50 r.p.m. by a rotating apparatus, the substrate was rinsed by showering with pure water from a spout nozzle located above the rotation center. The silicon wafer substrate was then spray-dried. The size of the colored pattern was measured by using a length measuring SEM S-9260A (manufactured by Hitachi High-Technologies Corporation). As the pattern size is nearer to 2 μm, the curability is more satisfactory and the sensitivity is more excellent. The measurement results are shown in Table 2.

6) Evaluation of Adhesion

A 4 mm×3 mm region of the spray-dried silicon wafer substrate having the undercoat layer was observed under an optical microscope, and the number of eliminated pattern components peeled off from the substrate was counted to be used as an index of evaluating the adhesion. The measurement results are shown in Table 2.

Examples 2 to 10 and Comparative Examples 1 to 4

Colored photosensitive resin compositions A-2 to A-14 were prepared to form a colored pattern, and evaluated in the same manner as Example 1 except for changing the coloring agent and the colorless compound of the invention in the colored photosensitive resin composition A-1 to those shown in Table 1, respectively. The measurement results are shown in Table 2.

TABLE 1

| | Composition | Coloring agent A | Coloring agent B | Colorless compound |
|---|---|---|---|---|
| Example 1 | A-1 | Specific example 28 | Compound b | Glycerol propoxylate (Mn 1500, ($\epsilon$ = 0)) |
| Example 2 | A-2 | Specific example 5 | Compound a | Poly(ethylene glycol)methyl ether (Mn 2000, ($\epsilon$ = 0)) |
| Example 3 | A-3 | Example Compound C-1 | Compound f | Poly(propylene glycol)monobutyl ether (Mn 2500, ($\epsilon$ = 0)) |
| Example 4 | A-4 | Example Compound C-6 | Compound c | Polyoxyethylene bis(amine) (Mn 2000, ($\epsilon$ = 0)) |
| Example 5 | A-5 | Example Compound C-49 | Compound d | Poly(propylene glycol)bis(2-amino-propyl ether) (Mn 2000, ($\epsilon$ = 0)) |
| Example 6 | A-6 | Compound e | Compound f | Poly(propylene glycol) (Mn 2000, ($\epsilon$ = 0)) |
| Example 7 | A-7 | Compound e | Compound c | Glycerol ethoxylate-co-pro-poxylate triol (Mn 2600, ($\epsilon$ = 0)) |
| Example 8 | A-8 | C.I. Acid Red 57 | Compound d | Bisphenol A ethoxylate (Mn 1500, ($\epsilon$ = 0)) |
| Example 9 | A-9 | C.I. Acid Blue 249 | Compound a | Trimethylolpropane ethoxylate (Mn 1014, ($\epsilon$ = 0)) |
| Example 10 | A-10 | C.I. Acid Blue 249 | Compound c | Glycerol ethoxylate (Mn 1500, ($\epsilon$ = 0)) |
| Comparative Example 1 | A-11 | C.I. Acid Blue 249 | Compound c | None |
| Comparative Example 2 | A-12 | C.I. Acid Blue 249 | Compound c | Ethylene glycol (Mn 6000, ($\epsilon$ = 0)) |
| Comparative Example 3 | A-13 | C.I. Pigment Red 254 | C.I. Pigment Yellow 139 | None |
| Comparative Example 4 | A-14 | C.I. Acid Blue 249 | Compound c | Pentaerythritol ethoxylate (Mn 797, ($\epsilon$ = 0)) |

*Mn represents a number average molecular weight.

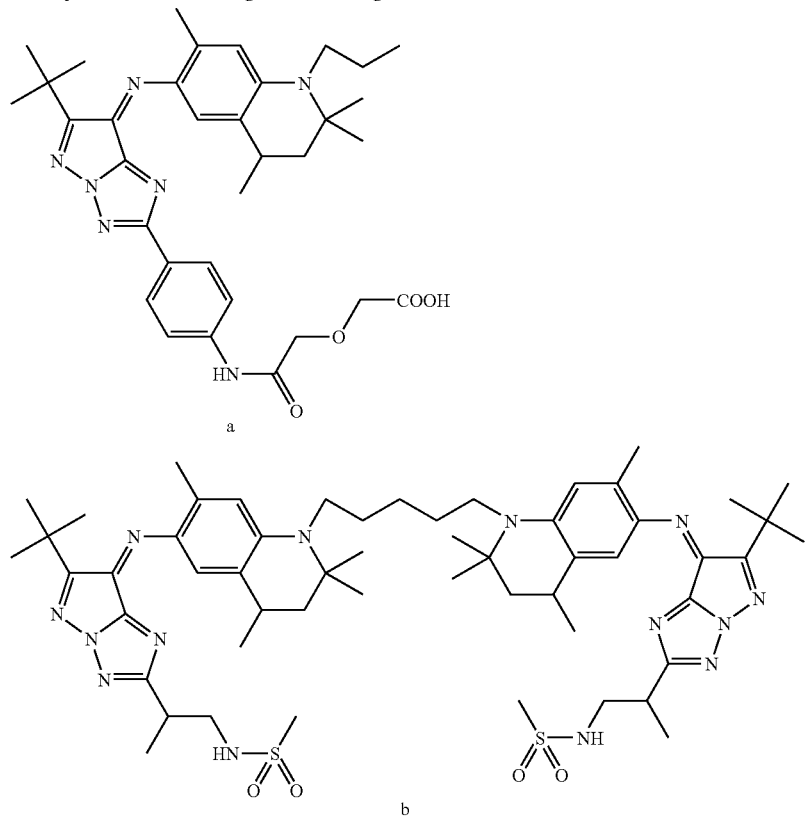

TABLE 1-continued

| Composition | Coloring agent A | Coloring agent B | Colorless compound |
|---|---|---|---| c d e f

TABLE 2

| | Composition | Number of in-liquid particles | | Pattern size A (μm) | Number of peeled off pattern components |
| --- | --- | --- | --- | --- | --- |
| | | Immediately after preparation | After 1 week storage | | |
| Example 1 | A-1 | 12 | 15 | 2.01 | 0 |
| Example 2 | A-2 | 19 | 24 | 2.00 | 0 |
| Example 3 | A-3 | 21 | 25 | 1.97 | 0 |
| Example 4 | A-4 | 22 | 27 | 1.97 | 0 |
| Example 5 | A-5 | 21 | 26 | 2.00 | 0 |
| Example 6 | A-6 | 13 | 16 | 1.94 | 0 |
| Example 7 | A-7 | 12 | 16 | 1.95 | 0 |
| Example 8 | A-8 | 14 | 21 | 1.94 | 0 |
| Example 9 | A-9 | 13 | 21 | 1.96 | 0 |
| Example 10 | A-10 | 15 | 22 | 1.95 | 0 |
| Comparative Example 1 | A-11 | 23 | 61 | 1.84 | 21 |
| Comparative Example 2 | A-12 | 31 | 84 | Residue was observed | 0 |
| Comparative Example 3 | A-13 | 23 | 68 | 2.03 | 9 |
| Comparative Example 4 | A-14 | 20 | 23 | 1.89 | 0 |

As shown in Table 2, in Examples of the invention, the contamination generation was suppressed, and excellent stabilities over time were achieved. Further, in each Example, the pattern was formed with the desired size, high sensitivity, and excellent adhesion without development residues.

On the other hand, in Comparative Examples, the contamination generation could not suppressed, and further the sensitivities were lowered, and the contact surfaces were deteriorated, so that the compositions of Comparative Examples were poor in sensitivity and adhesion.

According to the invention, a dye-containing negative working curable composition which has stability over time with reduced contamination generation and has adhesion to objects to be coated or supports, and which further exhibits high sensitivity and excellent pattern forming properties without development residue can be provided.

According to the invention, a color filter, which uses the dye-containing negative working curable composition, and is excellent in adhesion to a support, and a production method thereof can be provided.

The present invention includes the following embodiment.

<1> A dye-containing negative working curable composition comprising at least a dye, a photopolymerization initiator, a polymerizable monomer, and a colorless compound having a number average molecular weight of 1,000 to 5,000, wherein the ratio of an alkali-soluble resin to the total solid content of the composition is 10% by mass or less.

<2> The dye-containing negative working curable composition as described in <1>, wherein the colorless compound having a number average molecular weight of 1,000 to 5,000 has 2 or more hydroxyl groups.

<3> The dye-containing negative working curable composition as described in <1> or <2>, wherein the colorless compound having a number average molecular weight of 1,000 to 5,000 is alkali-insoluble.

<4> The dye-containing negative working curable composition as described in any one of <1> to <3>, wherein the content of the colorless compound having a number average molecular weight of 1,000 to 5,000 is 0.01 to 5.0 parts by mass based on 100 parts by mass of the solid content of the dye-containing negative working curable composition.

<5> The dye-containing negative working curable composition as described in any one of <1> to <4>, wherein the colorless compound having a number average molecular weight of 1,000 to 5,000 is free from photocrosslinkable groups and cyclic ether groups.

<6> The dye-containing negative working curable composition as described in any one of <1> to <5>, wherein the photopolymerization initiator is an oxime-based photopolymerization initiator.

<7> The dye-containing negative working curable composition as described in any one of <1> to <6>, wherein at least one of the dyes is a phthalocyanine compound represented by formula (I),

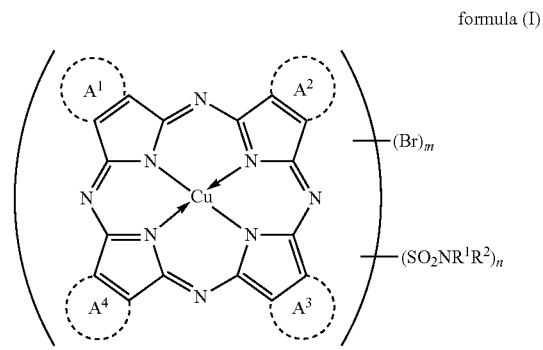

formula (I)

wherein in formula (I), ring $A^1$, ring $A^2$, ring $A^3$ and ring $A^4$ each independently represent one of the following aromatic rings,

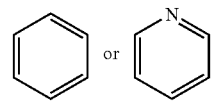

wherein at least one of ring $A^1$, ring $A^2$, ring $A^3$ and ring $A^4$ represents the following aromatic ring,

and wherein in formula (I), $R^1$ and $R^2$ each independently represent a hydrogen atom or a substituted or unsubstituted alkyl group, $R^1$ and $R^2$ are not a hydrogen atom at the same time, m is an integer from 1 to 8, and n is an integer from 1 to 4.

<8> The dye-containing negative working curable composition as described in any one of <1> to <7>, wherein at least one of the dyes is a phthalocyanine compound represented by formula (II), having a number average molecular weight of 1,000 to 5,000 is a compound having a partial structure represented by formula (IV),

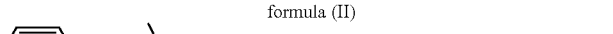

—O-L-$(C_aH_bO)_n$—H  formula (IV)

wherein in formula (IV), L represents a single bond, an aliphatic group, an aromatic group, or a carbonyl group, a represents 2 or 3; b represents an integer of 2a; and n represents an integer.

formula (II)

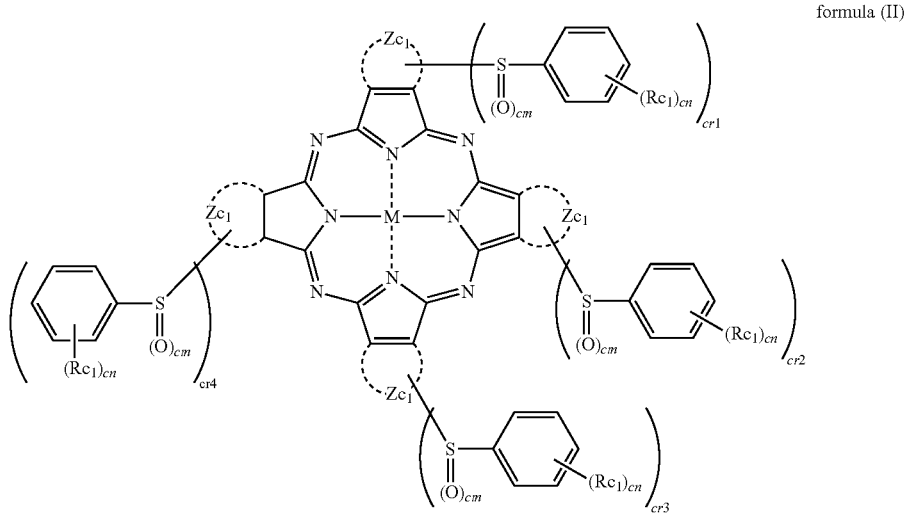

wherein in formula (II), $Rc_1$ is a halogen atom, an aliphatic group, an aryl group, a heterocyclic group, a cyano group, a carboxyl group, a carbamoyl group, an aliphatic oxycarbonyl group, an aryloxycarbonyl group, an acyl group, a hydroxyl group, an aliphatic oxygroup, an aryloxy group, acyloxy group, a carbamoyloxy group, a heterocyclic oxy group, an aliphatic oxycarbonyloxy group, an N-alkylacylamino group, a carbamoyl amino group, a sulfamoylamino group, an aliphatic oxycarbonylamino group, an aryloxycarbonylamino group, an aliphatic sulfonylamino group, an arylsulfonylamino group, an aliphatic thio group, an arylthio group, an aliphatic sulfonyl group, an arylsulfonyl group, a sulfamoyl group, a sulfo group, an imido group or a heterocyclic thio group; $Zc_1$ is a nonmetal atom group required for forming a 6-membered ring together with carbon atoms; four $Zc_1$s may be identical with or different from each other; M is two hydrogen atoms, a divalent metal atom, a divalent metal oxide, a divalent metal hydroxide or a divalent metal chloride; cm is 0, 1 or 2; cn is 0 or an integer from 1 to 5; four cn's may be identical with or different from each other; one cn is an integer from 1 to 5; a plurality of $Rc_1$s in a molecule may be identical with or different from each other; cr1, cr2, cr3 and cr4 are each 0 or 1; and cr1+cr2+cr3+cr4≧1 is satisfied.

<9> The dye-containing negative working curable composition as described in any one of <1> to <8>, wherein the content of the polymerizable monomer relative to the total solid content of the dye-containing negative working curable composition is 20.0% to 70.0% by mass.

<10> The dye-containing negative working curable composition as described in <1>, wherein the colorless compound has a number average molecular weight of 1,400 to 3,000.

<11> The dye-containing negative working curable composition as described in <1>, wherein the colorless compound <12> The dye-containing negative working curable composition as described in <11>, wherein the compound which has the partial structure represented by the formula (IV) has a propoxylate structure in which a=3, b=6, and n=5 or more.

<13> The dye-containing negative working curable composition as described in <11>, wherein the colorless compound having a number average molecular weight of 1,000 to 5,000 is a compound having two or more partial structures represented by the formula (IV).

<14> A production method for a color filter, comprising: coating the dye-containing negative working curable composition as described in any one of <1> to <13> onto a support to form a coated film; exposing the coated film through a mask; and developing the coated film to form a pattern.

<15> A color filter formed by the production method as described in <14>.

The foregoing description of the exemplary embodiments of the present invention has been provided for the purposes of illustration and description. It is not intended to be exhaustive or to limit the invention to the precise forms disclosed. Obviously, many modifications and variations will be apparent to practitioners skilled in the art. The exemplary embodiments were chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

All publications, patent applications, and technical standards mentioned in this specification are herein incorporated by reference to the same extent as if each individual publication, patent application, or technical standard was specifically and individually indicated to be incorporated by reference.

What is claimed is:

1. A dye-containing negative working curable composition comprising at least a dye, a photopolymerization initiator, a polymerizable monomer, and a colorless compound having a number average molecular weight of 1,000 to 5,000, wherein the ratio of an alkali-soluble resin to the total solid content of the composition is 8% by mass or less; and the colorless compound having a number average molecular weight of 1,000 to 5,000 is a compound having a partial structure represented by formula (IV), —O-L-$(C_aH_bO)_n$—H    formula (IV)

wherein in formula (IV), L represents a single bond, an aliphatic group, an aromatic group, or a carbonyl group; a represents 2 or 3; b represents an integer of 2a; and n represnts an integer.

2. The dye-containing negative working curable composition according to claim 1, wherein the colorless compound having a number average molecular weight of 1,000 to 5,000 has 2 or more hydroxyl groups.

3. The dye-containing negative working curable composition according to claim 1, wherein the colorless compound having a number average molecular weight of 1,000 to 5,000 is alkali-insoluble.

4. The dye-containing negative working curable composition according to claim 1, wherein the content of the colorless compound having a number average molecular weight of 1,000 to 5,000 is 0.01 to 5.0 parts by mass based on 100 parts by mass of the solid content of the dye-containing negative working curable composition.

5. The dye-containing negative working curable composition according to claim 1, wherein the colorless compound having a number average molecular weight of 1,000 to 5,000 is free from photocrosslinkable groups and cyclic ether groups.

6. The dye-containing negative working curable composition according to claim 1, wherein the photopolymerization initiator is an oxime-based photopolymerization initiator.

7. The dye-containing negative working curable composition according to claim 1, wherein at least one of the dyes is a phthalocyanine compound represented by formula (I),

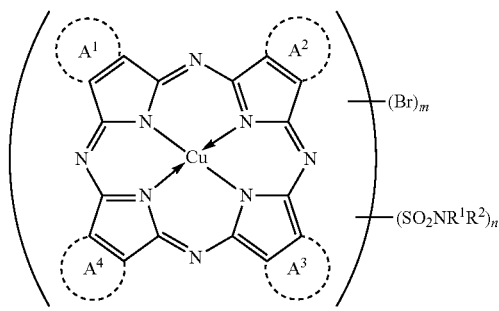

wherein in formula (I), ring $A^1$, ring $A^2$, ring $A^3$ and ring $A^4$ each independently represents one of the following aromatic rings,

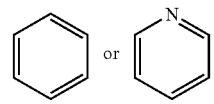

wherein at least one of ring $A^1$, ring $A^2$, ring $A^3$ and ring $A^4$ represents the following aromatic ring,

and wherein in formula (I), $R^1$ and $R^2$ each independently represents a hydrogen atom or a substituted or unsubstituted alkyl group, $R^1$ and $R^2$ are not a hydrogen atom at the same time, m is an integer from 1 to 8, and n is an integer from 1 to 4.

8. The dye-containing negative working curable composition

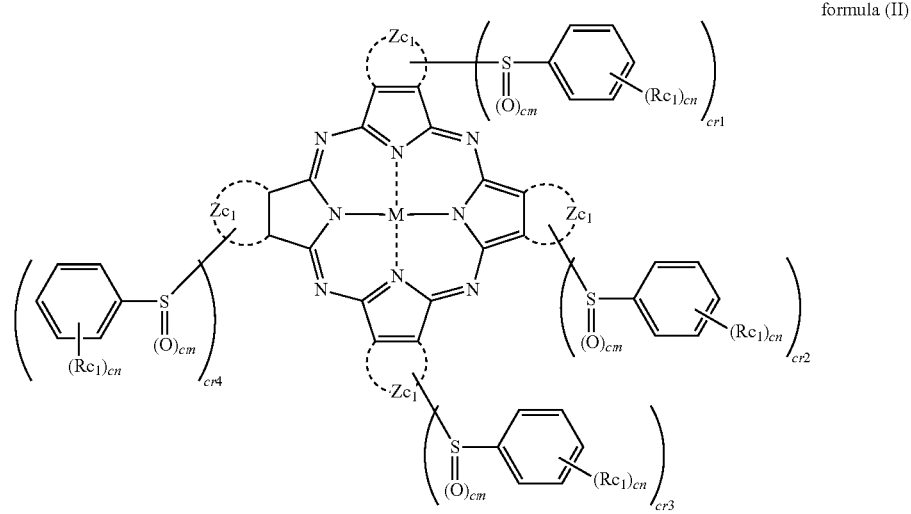

according to claim 1, wherein at least one of the dyes is a phthalocyanine compound represented by formula (II), wherein in formula (II), $Rc_1$ is a halogen atom, an aliphatic group, an aryl group, a heterocyclic group, a cyano group, a carboxyl group, a carbamoyl group, an aliphatic oxycarbonyl group, an aryloxycarbonyl group, an acyl group, a hydroxyl group, an aliphatic oxygroup, an aryloxy group, acyloxy group, a carbamoyloxy group, a heterocyclic oxy group, an aliphatic oxycarbonyloxy group, an N-alkylacylamino group, a carbamoyl amino group, a sulfamoylamino group, an aliphatic oxycarbonylamino group, an aryloxycarbonylamino group, an aliphatic sulfonylamino group, an arylsulfonylamino group, an aliphatic thio group, an arylthio group, an aliphatic sulfonyl group, an arylsulfonyl group, a sulfamoyl group, a sulfo group, an imido group or a heterocyclic thio group; $Zc_1$ is a nonmetal atom group required for forming a 6-membered ring together with carbon atoms; four $Zc_1$s may be identical to or different from each other; M is two hydrogen atoms, a divalent metal atom, a divalent metal oxide, a divalent metal hydroxide or a divalent metal chloride; cm is 0, 1 or 2; cn is 0 or an integer from 1 to 5; four cn's may be identical to or different from each other; one cn is an integer from 1 to 5; a plurality of $Rc_1$s in a molecule may be identical to or different from each other; cr1, cr2, cr3 and cr4 are each 0 or 1; and cr1+cr2+cr3+cr4≧1 is satisfied.

9. The dye-containing negative working curable composition according to claim 1, wherein the content of the polymerizable monomer relative to the total solid content of the dye-containing negative working curable composition is 20.0% to 70.0% by mass.

10. The dye-containing negative working curable composition according to claim 1, wherein the colorless compound has a number average molecular weight of 1,400 to 3,000.

11. The dye-containing negative working curable composition according to claim 1, wherein the compound which has the partial structure represented by the formula (IV) has a propoxylate structure in which a=3, b=6, and n=5 or more.

12. The dye-containing negative working curable composition according to claim 1, wherein the colorless compound having a number average molecular weight of 1,000 to 5,000 is a compound having two or more partial structures represented by the formula (IV).

13. A production method for a color filter, comprising:
coating the dye-containing negative working curable composition according to claim 1 onto a support to form a coated film;
exposing the coated film through a mask; and
developing the coated film to form a pattern.

14. A color filter formed by the production method of claim 13.

15. A dye-containing negative working curable composition comprising at least a dye, a photopolymerization initiator, a polymerizable monomer, and a colorless compound having a number average molecular weight of 1,000 to 5,000, wherein the ratio of an alkali-soluble resin to the total solid content of the composition is 10% by mass or less, the photopolymerization initiator is an oxime-based photopolymerization initiator, and the colorless compound having a number average molecular weight of 1,000 to 5,000 is a compound having a partial structure represented by formula (IV):

  formula (IV)

wherein in formula (IV), L represents a single bond, an aliphatic group, an aromatic group, or a carbonyl group; a represents 2 or 3; b represents an integer of 2a; and n represents an integer.

16. The dye-containing negative working curable composition according to claim 15, wherein the colorless compound having a number average molecular weight of 1,000 to 5,000 has 2 or more hydroxyl groups.

17. The dye-containing negative working curable composition according to claim 15, wherein the colorless compound having a number average molecular weight of 1,000 to 5,000 is alkali-insoluble.

18. The dye-containing negative working curable composition according to claim 15, wherein the content of the colorless compound having a number average molecular weight of 1,000 to 5,000 is 0.01 to 5.0 parts by mass based on 100 parts by mass of the solid content of the dye-containing negative working curable composition.

19. The dye-containing negative working curable composition according to claim 15, wherein the colorless compound having a number average molecular weight of 1,000 to 5,000 is free from photocrosslinkable groups and cyclic ether groups.

20. The dye-containing negative working curable composition according to claim 15, wherein at least one of the dyes is a phthalocyanine compound represented by formula (I),

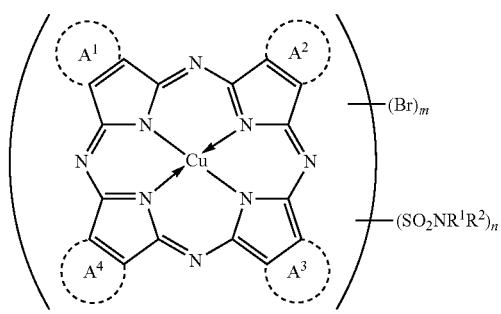

formula (I)

wherein in formula (I) ring $A^1$, ring $A^2$, ring $A^3$ and ring $A^4$ each independently represents one of the following aromatic rings,

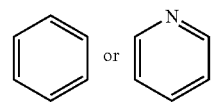

wherein at least one of ring $A^1$, ring $A^2$, ring $A^3$ and ring $A^4$ represents the following aromatic ring,

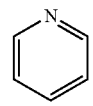

and wherein in formula (I), $R^1$ and $R^2$ each independently represents a hydrogen atom or a substituted or unsubstituted alkyl group, $R^1$ and $R^2$ are not a hydrogen atom at the same time, m is an integer from 1 to 8, and n is an integer from 1 to 4.

21. The dye-containing negative working curable composition according to claim 15, wherein at least one of the dyes is a phthalocyanine compound represented by formula (II),

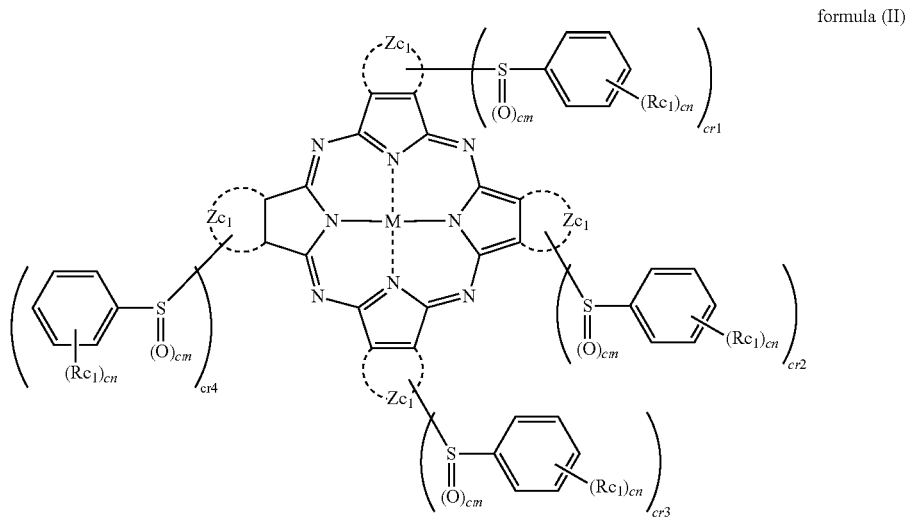

formula (II)

wherein in formula (II), $Rc_1$ is a halogen atom, an aliphatic group, an aryl group, a heterocyclic group, a cyano group, a carboxyl group, a carbamoyl group, an aliphatic oxycarbonyl group, an aryloxycarbonyl group, an acyl group, a hydroxyl group, an aliphatic oxygroup, an aryloxy group, acyloxy group, a carbamoyloxy group, a heterocyclic oxy group, an aliphatic oxycarbonyloxy group, an N-alkylacylamino group, a carbamoyl amino group, a sulfamoylamino group, an aliphatic oxycarbonylamino group, an aryloxycarbonylamino group, an aliphatic sulfonylamino group, an arylsulfonylamino group, an aliphatic thio group, an arylthio group, an aliphatic sulfonyl group, an arylsulfonyl group, a sulfamoyl group, a sulfo group, an imido group or a heterocyclic thio group; Zc is a nonmetal atom group required for forming a 6-membered ring together with carbon atoms; four $Zc_1$s may be identical to or different from each other; M is two hydrogen atoms, a divalent metal atom, a divalent metal oxide, a divalent metal hydroxide or a divalent metal chloride; cm is 0, 1 or 2; cn is 0 or an integer from 1 to 5; four cn's may be identical to or different from each other; one cn is an integer from 1 to 5; a plurality of $Rc_1$s in a molecule may be identical to or different from each other; cr1, cr2, cr3 and cr4 are each 0 or 1; and cr1+cr2+cr3+cr4 $\geq$ 1 is satisfied.

22. The dy-containing negative working curable composition according to claim 15, wherein the content of the polymerizable monomer relative to the total solid content of the dye-containing negative working curable composition is 20.0% to 70.0% by mass.

23. The dye-containing negative working curable composition according to claim 15, wherein the colorless compound has a number averagel molecular weight of 1,400 to 3,000.

24. The dye-containing negative working curable composition according to claim 15, wherein the compound which has the partial structure represented by the formula (IV) has a propoxylate structure in which a=3, b=6, and n=5 or more.

25. The dye-containing negative working curable composition according to claim 15, wherein the colorless compound having a number average molecular weight of 1,000 to 5,000 is a compound having two or more partial structures represented by the formula (IV).

26. A production method for a color filter, comprising:
coating the dye-containing negative working curable composition according to claim 15 onto a support to form a coated film;
exposing the coated film through a mask; and
developing the coated film to form a pattern.

27. A color filter formed by the production method of claim 26.

* * * * *